US012660614B2

(12) United States Patent
Yoshino et al.

(10) Patent No.: US 12,660,614 B2
(45) Date of Patent: Jun. 16, 2026

(54) SEMICONDUCTOR DEVICE

(71) Applicant: Mitsubishi Electric Corporation, Tokyo (JP)

(72) Inventors: Manabu Yoshino, Tokyo (JP); Motoki Imanishi, Tokyo (JP); Yasuo Yamaguchi, Tokyo (JP); Toshihiro Imasaka, Tokyo (JP); Yohei Torii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 283 days.

(21) Appl. No.: 18/353,735

(22) Filed: Jul. 17, 2023

(65) Prior Publication Data

US 2024/0128187 A1      Apr. 18, 2024

(30) Foreign Application Priority Data

Oct. 14, 2022    (JP) ................................. 2022-165185

(51) Int. Cl.
H10W 20/40        (2026.01)
H10D 89/60        (2025.01)
H10W 20/43        (2026.01)

(52) U.S. Cl.
CPC .......... H10W 20/497 (2026.01); H10D 89/60 (2025.01); H10W 20/43 (2026.01)

(58) Field of Classification Search
CPC .... H10W 20/497; H10W 20/43; H10D 89/60; H02M 1/088
See application file for complete search history.

(56) References Cited

U.S. PATENT DOCUMENTS 3,767,964 A * 10/1973 Varian ...................... H03K 4/69
                                                                313/433
4,572,637 A *  2/1986 Inoue ................... G03B 17/425
                                                                396/409
5,900,683 A *  5/1999 Rinehart ............. H03K 17/567
                                                                307/129

(Continued)

FOREIGN PATENT DOCUMENTS

CN        106486269 B  * 9/2018   ............. H03H 7/427
CN        110581638 A  * 12/2019   ........... H01L 21/761

(Continued)

OTHER PUBLICATIONS

Office Action issued in DE 10 2023 124 363.2; mailed by the German Patent and Trademark Office on Apr. 8, 2025.

(Continued)

*Primary Examiner* — Laura M Menz
(74) *Attorney, Agent, or Firm* — Studebaker Brackett PLLC

(57)        ABSTRACT

An isolation region separates a first circuit region and a second circuit region. A signal conveyance element is an element to convey a signal from the first circuit region to the second circuit region and includes at least one primary coil and two secondary coils. The at least one primary coil has opposite ends electrically connected to the first circuit region and is disposed in the isolation region. The two secondary coils each have opposite ends electrically connected to the second circuit region, are arranged to be magnetically coupled to the at least one primary coil, and are arranged in the isolation region.

7 Claims, 21 Drawing Sheets

(56) References Cited

U.S. PATENT DOCUMENTS

| | | | | |
|---|---|---|---|---|
| 9,698,654 | B2 * | 7/2017 | Santos | H02H 7/0822 |
| 10,547,252 | B2 * | 1/2020 | Imanishi | H10D 62/8503 |
| 10,818,591 | B2 * | 10/2020 | Uchida | H01L 23/5227 |
| 11,333,123 | B2 * | 5/2022 | Ueno | H03K 17/08122 |
| 12,431,887 | B2 * | 9/2025 | Imanishi | H03K 17/08128 |
| 2005/0161761 | A1 * | 7/2005 | Hatade | H10D 30/655 |
| | | | | 257/490 |
| 2007/0063293 | A1 | 3/2007 | Terashima | |
| 2009/0224264 | A1 * | 9/2009 | Feldtkeller | H01L 21/76224 |
| | | | | 257/E21.546 |
| 2013/0055052 | A1 | 2/2013 | Kaeriyama | |
| 2014/0103736 | A1 * | 4/2014 | Akahane | H01F 38/14 |
| | | | | 307/104 |
| 2014/0217466 | A1 | 8/2014 | Yamaji | |
| 2015/0137314 | A1 * | 5/2015 | Osada | H01F 27/288 |
| | | | | 257/531 |
| 2017/0271506 | A1 | 9/2017 | Yamaji | |
| 2018/0308795 | A1 * | 10/2018 | Uchida | H01L 23/5227 |
| 2019/0379298 | A1 * | 12/2019 | Imanishi | H10D 62/8325 |
| 2020/0212171 | A1 * | 7/2020 | Yoshino | H10D 84/038 |
| 2024/0030276 | A1 * | 1/2024 | Wada | H02M 1/08 |
| 2024/0128187 | A1 * | 4/2024 | Yoshino | H10D 89/60 |
| 2024/0146294 | A1 * | 5/2024 | Imanishi | H03K 17/08128 |
| 2025/0176196 | A1 * | 5/2025 | Shitomi | H10D 1/20 |

FOREIGN PATENT DOCUMENTS

| | | | | | |
|---|---|---|---|---|---|
| CN | 110581638 | B | * | 7/2021 | H10D 62/8503 |
| CN | 113872577 | A | * | 12/2021 | H03K 17/0828 |
| CN | 117894821 | A | * | 4/2024 | H10D 89/60 |
| CN | 120072806 | A | * | 5/2025 | H01L 23/645 |
| DE | 102004059620 | A1 | | 8/2005 | |
| DE | 102006038860 | A1 | | 3/2007 | |
| DE | 102008012858 | A1 | | 10/2009 | |
| DE | 102017211494 | A1 | * | 1/2018 | H03K 17/567 |
| DE | 102019207701 | A1 | * | 12/2019 | H01L 21/761 |
| DE | 102019220407 | A1 | | 7/2020 | |
| DE | 112022001264 | T5 | | 12/2023 | |
| DE | 102023124363 | A1 | * | 4/2024 | H10D 89/60 |
| DE | 102019207701 | B4 | * | 9/2024 | H10D 62/8503 |
| DE | 102024131671 | A1 | * | 6/2025 | H01L 23/645 |
| JP | 2013-051547 | A | | 3/2013 | |
| JP | 2017-112356 | A | | 6/2017 | |
| JP | 2017-174858 | A | | 9/2017 | |
| JP | 2018-182223 | A | | 11/2018 | |
| JP | 2019216133 | A | * | 12/2019 | H02M 1/08 |
| JP | 6793741 | B2 | * | 12/2020 | H04B 3/54 |
| JP | 6843799 | B2 | * | 3/2021 | H10D 62/8503 |
| JP | 2024058063 | A | * | 4/2024 | H10D 89/60 |
| JP | 2025087238 | A | * | 6/2025 | H01L 23/645 |
| KR | 20180122283 | A | * | 11/2018 | H01F 17/0013 |
| WO | 2013/069408 | A1 | | 5/2013 | |
| WO | WO-2018066165 | A1 | * | 4/2018 | H02M 7/06 |
| WO | 2022/065007 | A1 | | 3/2022 | |
| WO | 2022/210551 | A1 | | 10/2022 | |

OTHER PUBLICATIONS

"Notice of Reasons for Refusal" Office Action issued in JP 2022-165185; mailed by the Japanese Patent Office on Jan. 6, 2026.

* cited by examiner

F I G. 2
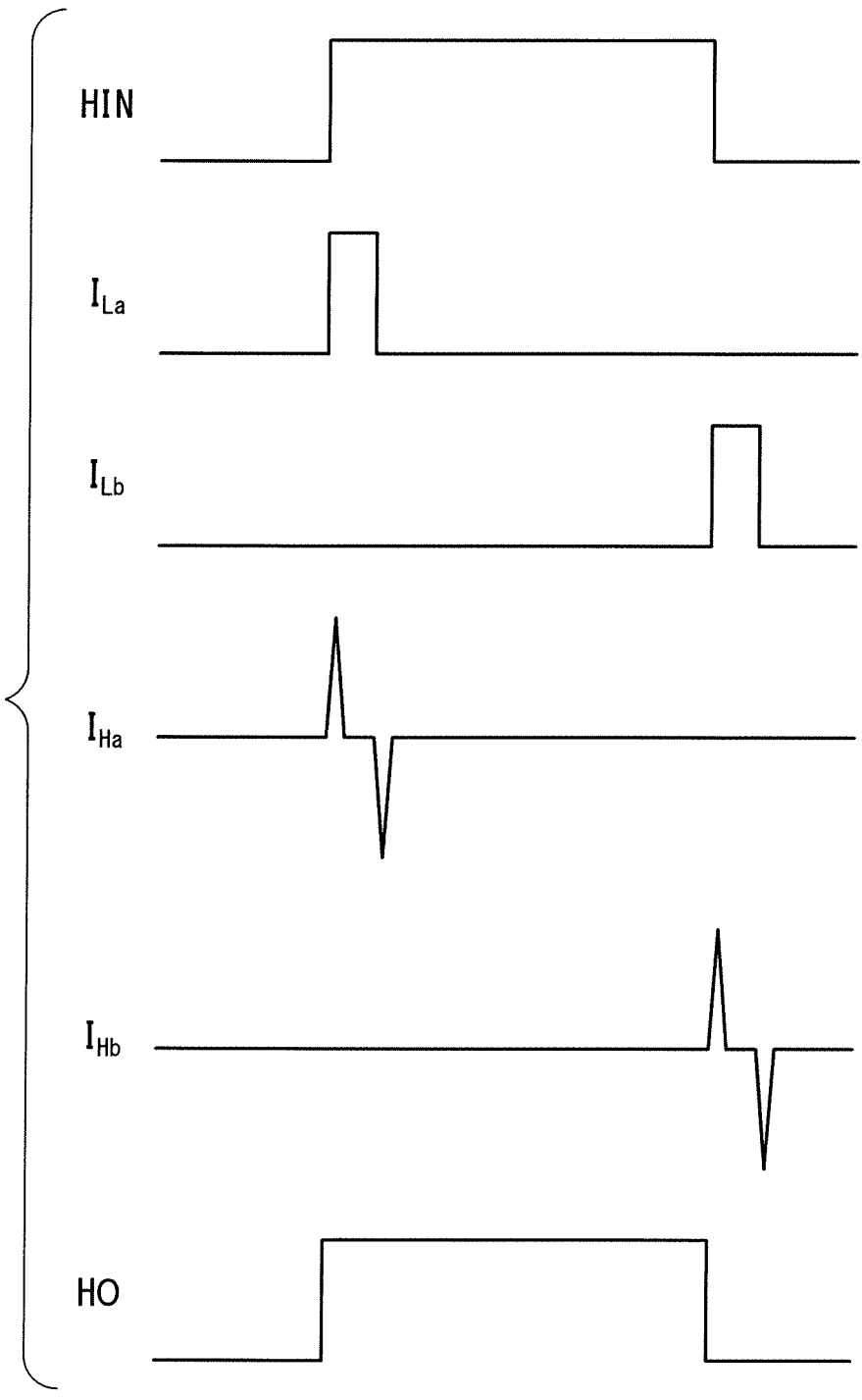

F I G. 4
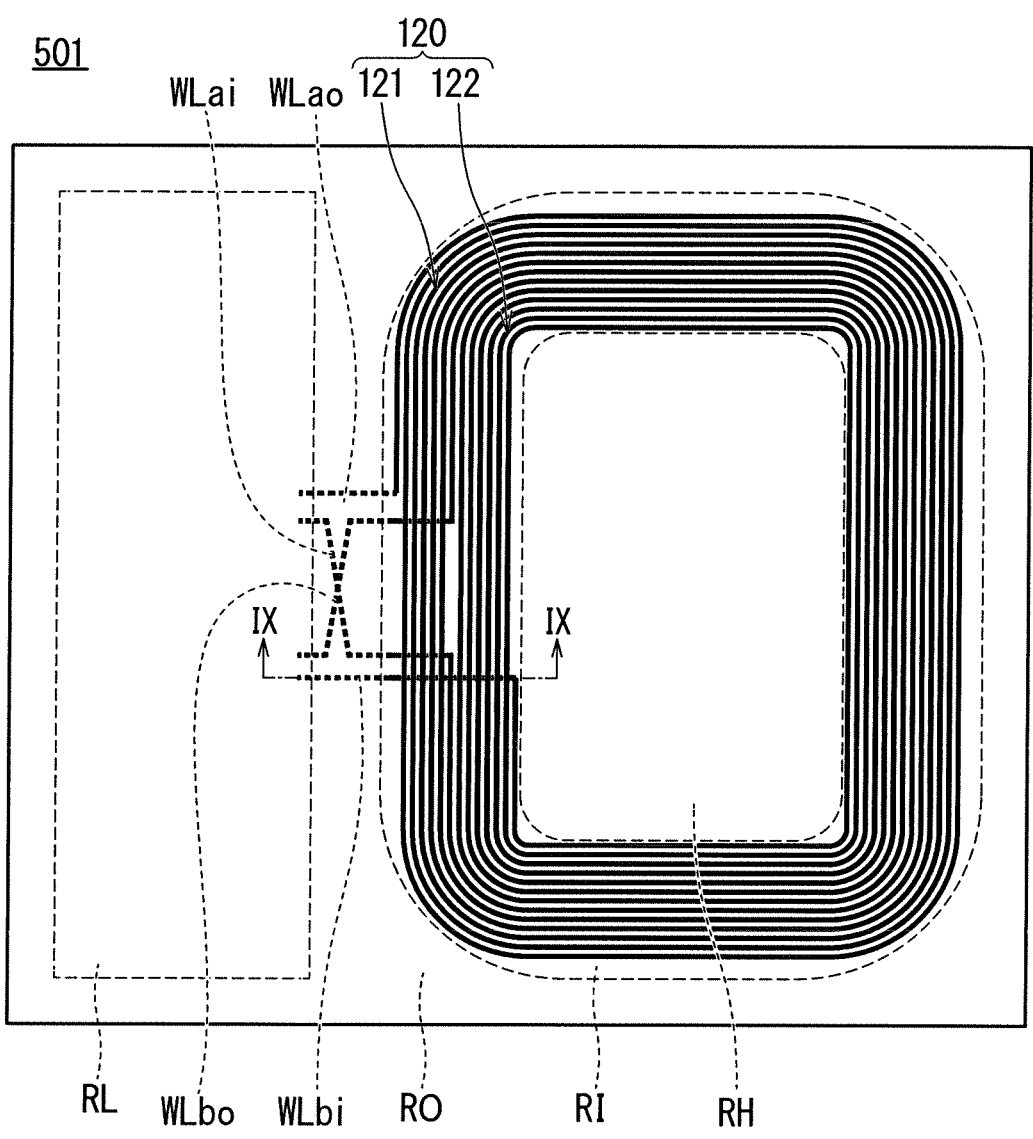

F I G. 6
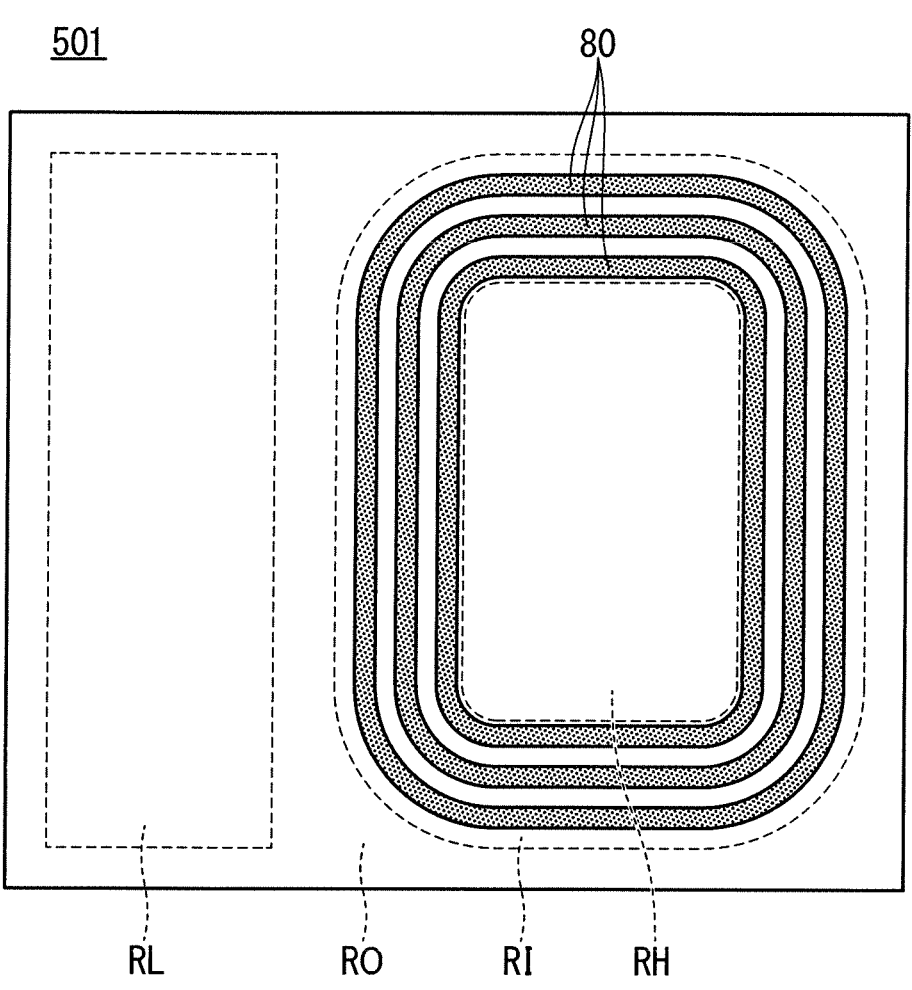

501

501

501

F I G. 1 1
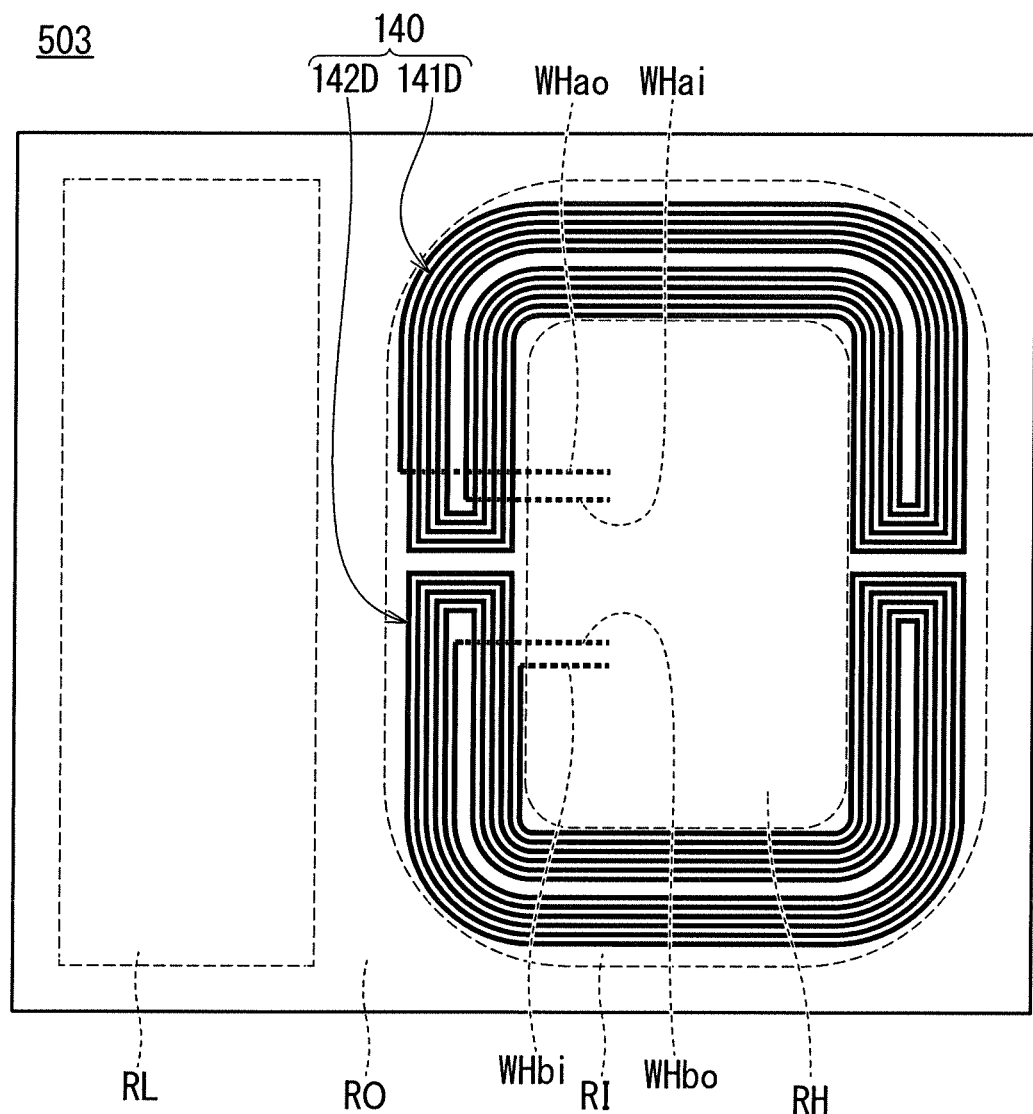

F I G . 13
504
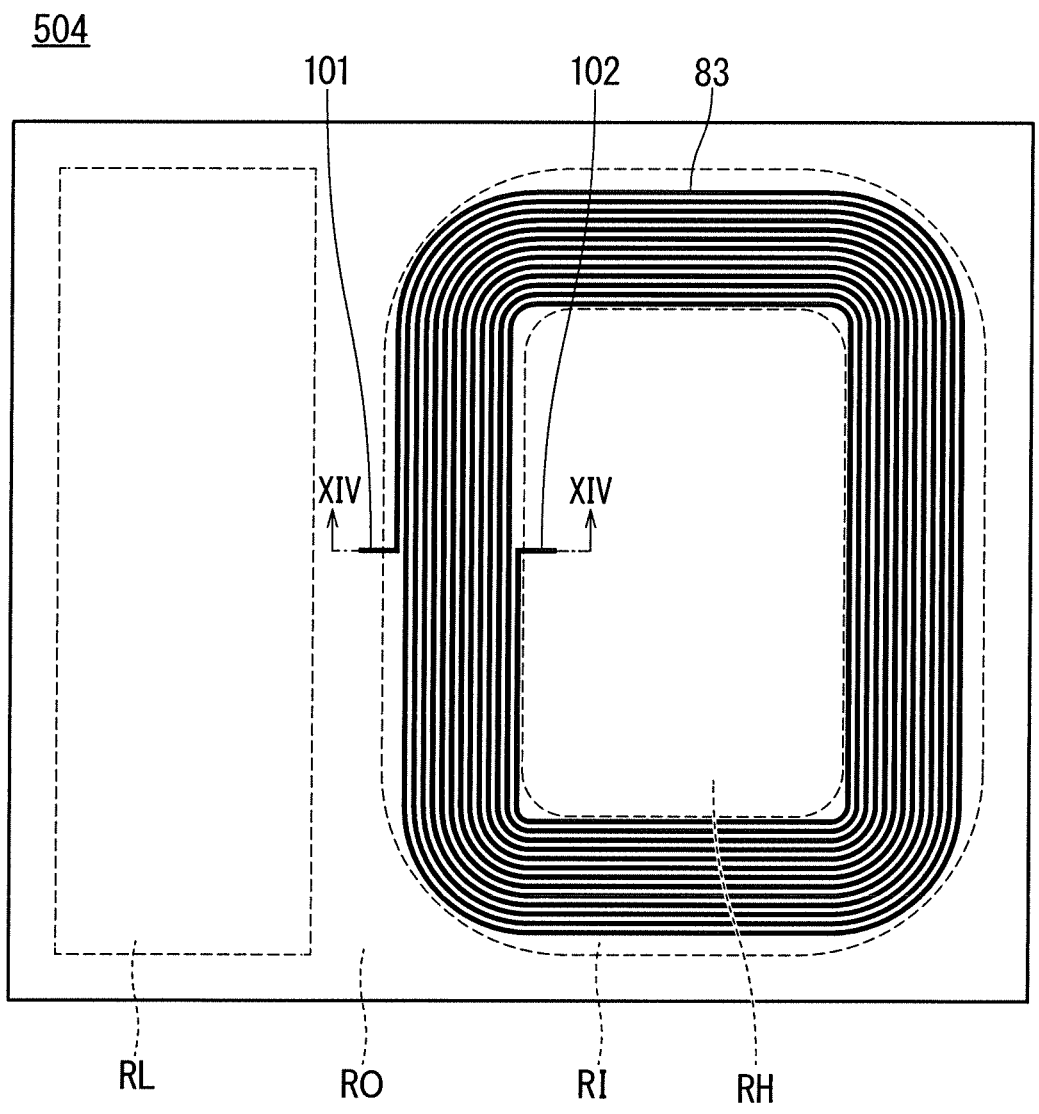
101    102    83
XIV    XIV
RL    RO    RI    RH

F I G. 15
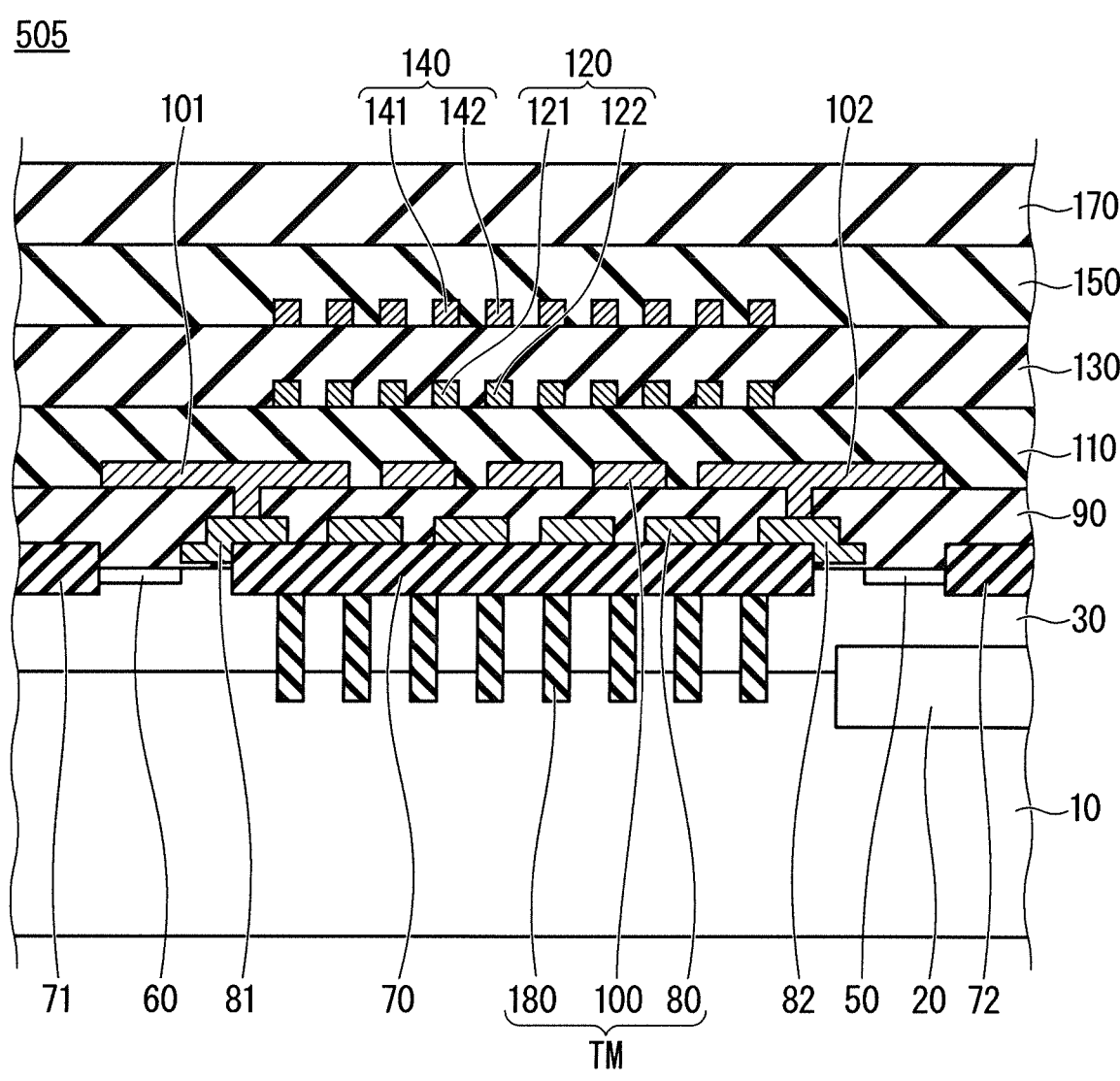

F I G. 1 7
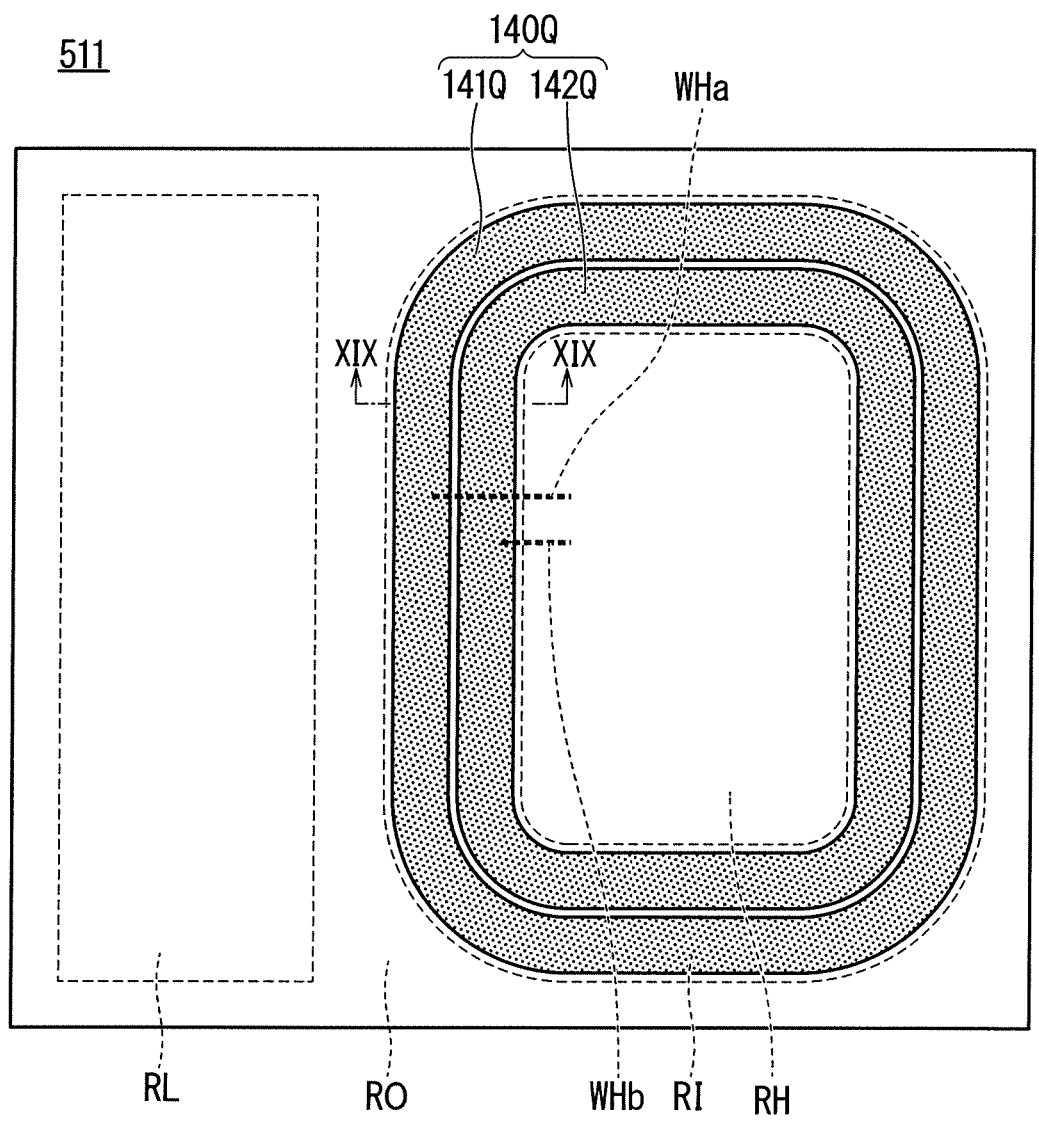

F I G. 18
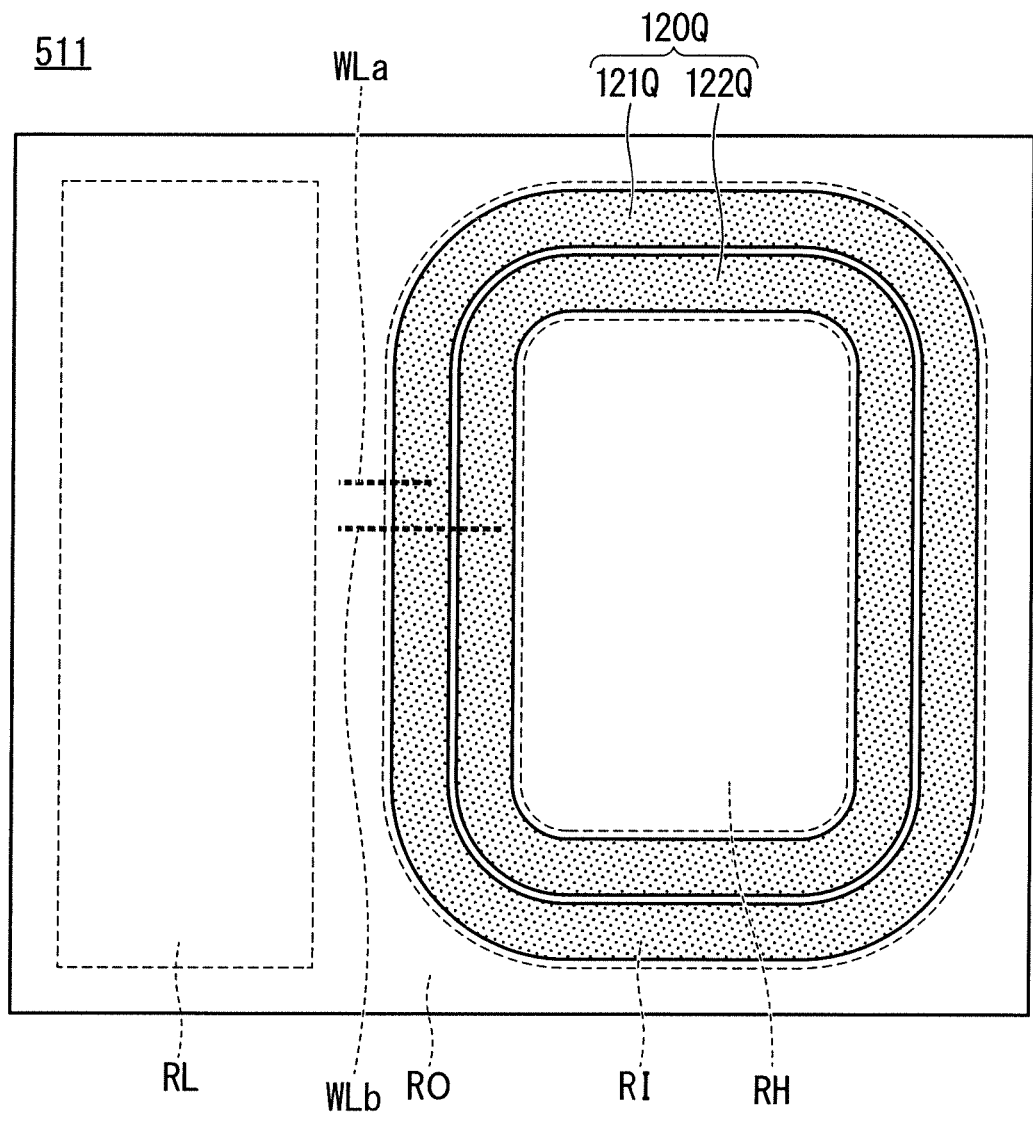

F I G. 2 1
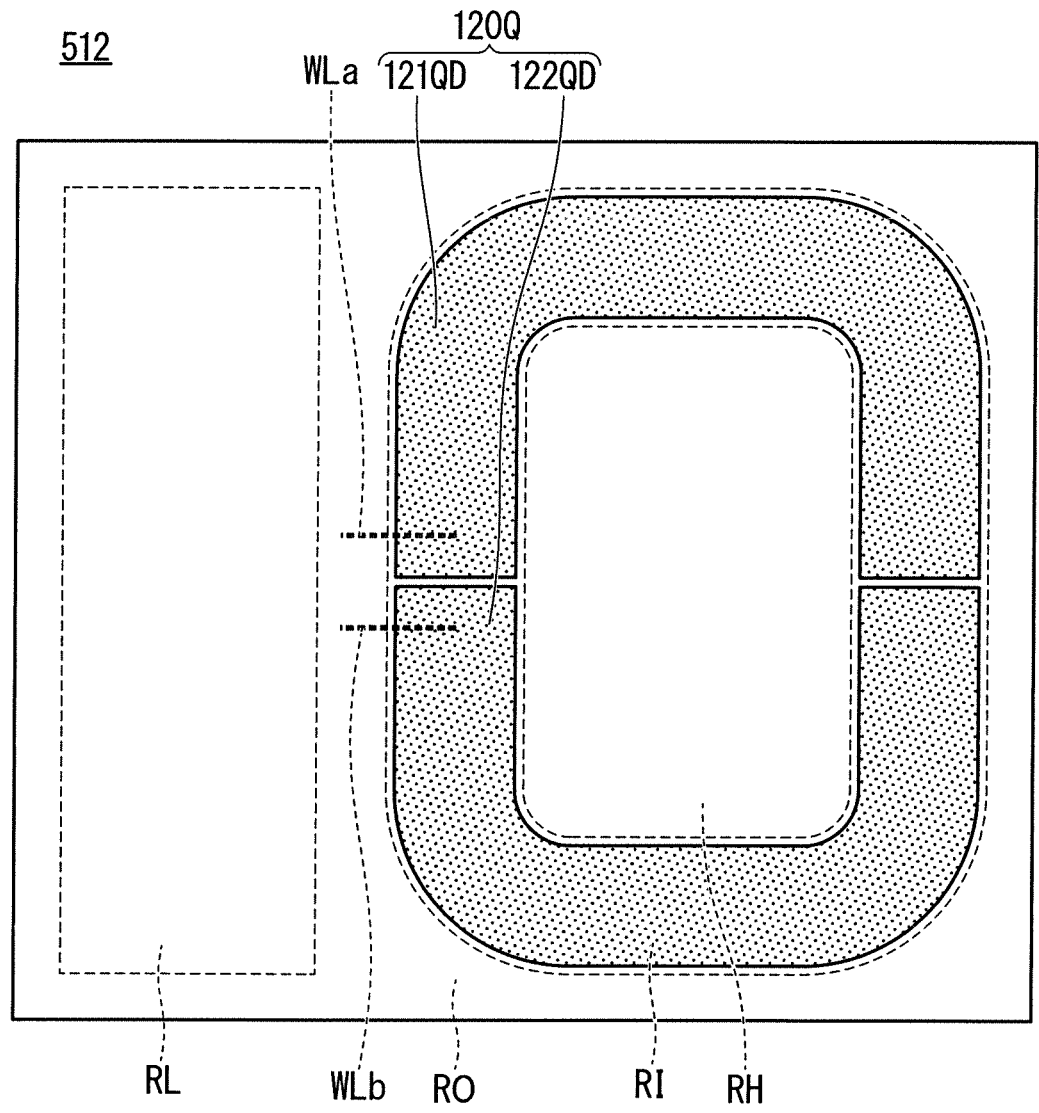

SEMICONDUCTOR DEVICE

BACKGROUND OF THE INVENTION

Field of the Invention

The present disclosure relates to semiconductor devices and, in particular, to a semiconductor device having a first circuit region, a second circuit region, and an isolation region separating the first circuit region and the second circuit region, and including a signal conveyance element to convey a signal from the first circuit region to the second circuit region.

Description of the Background Art

Japanese Patent No. 6843799 discloses a semiconductor device, such as a high voltage integrated circuit (HVIC), having a signal transmission function involving insulation and a level shift. In the semiconductor device, a first signal output circuit is connected to a first power supply node and a first ground node. A second signal output circuit is connected to a second power supply node electrically separated from the first power supply node and a second ground node electrically separated from the first ground node. A PN junction portion is formed of a P-type part electrically connected to the first ground node and an N-type part electrically connected to the second power supply node. A magnetic coupling element has first and second conductor coils magnetically coupled to each other. The first conductor coil is electrically connected to an output side of the first signal output circuit. The second conductor coil is electrically connected to an input side of the second signal output circuit. This configuration allows for the level shift involving insulation by the magnetic coupling element without involving fast switching of a transistor. The patent claims that this can secure a stable signal transmission function and suppress power loss and noise during driving at a high frequency.

The above-mentioned patent discloses that the magnetic coupling element (a signal conveyance element) is disposed in a low voltage region (low side circuit region). A portion of the low side circuit region where the signal conveyance element is disposed is difficult to be used for other purposes and is substantially an ineffective region in terms other than signal conveyance. The semiconductor device disclosed in the above-mentioned patent thus has a problem in that a chip size of the semiconductor device might increase due to the need to secure a region in which the signal conveyance element is disposed.

SUMMARY

The present disclosure has been conceived to solve a problem as described above, and it is an object of the present disclosure to provide a semiconductor device capable of suppressing an increase in chip size caused by disposing a signal conveyance element.

One semiconductor device according to the present disclosure is a semiconductor device having a first circuit region, a second circuit region, and an isolation region separating the first circuit region and the second circuit region, and including a signal conveyance element to convey a signal from the first circuit region to the second circuit region. The semiconductor device includes: a first drive circuit disposed in the first circuit region and having a first reference potential; a second drive circuit disposed in the second circuit region and having a second reference potential as a floating potential electrically separated from the first reference potential; a high voltage junction termination disposed in the isolation region to secure a breakdown voltage between the first circuit region and the second circuit region; at least one primary coil having opposite ends electrically connected to the first circuit region, having a coil axis in the second circuit region or the isolation region, and disposed in the isolation region; an insulating film covering the at least one primary coil; and two secondary coils each having opposite ends electrically connected to the second circuit region, each having a coil axis in the second circuit region or the isolation region, separated from the at least one primary coil by the insulating film, arranged in the isolation region to be magnetically coupled to the at least one primary coil, and included in the signal conveyance element along with the at least one primary coil.

Another semiconductor device according to the present disclosure is a semiconductor device having a first circuit region, a second circuit region, and an isolation region separating the first circuit region and the second circuit region, and including a signal conveyance element to convey a signal from the first circuit region to the second circuit region. The semiconductor device includes: a first drive circuit disposed in the first circuit region and having a first reference potential; a second drive circuit disposed in the second circuit region and having a second reference potential as a floating potential electrically separated from the first reference potential; a high voltage junction termination disposed in the isolation region to secure a breakdown voltage between the first circuit region and the second circuit region; two first electrode plates electrically connected to the first circuit region and arranged in the isolation region; an insulating film covering the two first electrode plates; and two second electrode plates electrically connected to the second circuit region, separated from the two first electrode plates by the insulating film, arranged in the isolation region to be capacitively coupled to the respective two first electrode plates, and included in the signal conveyance element along with the two first electrode plates.

According to the semiconductor device according to the present disclosure, an increase in chip size caused by disposing the signal conveyance element can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a signal waveform diagram showing a sequence of high side control performed by the semiconductor device of FIG. 1;

FIG. 4 is a plan view illustrating arrangement in the in-plane direction of two primary coils of the signal conveyance element of the semiconductor device according to Embodiment 1 along with four wiring layers extending from ends of the primary coils;

FIG. 6 is a plan view illustrating arrangement of poly-silicon layers of the field plate of the semiconductor device according to Embodiment 1;

FIG. 11 is a plan view illustrating arrangement in the in-plane direction of two secondary coils of a signal conveyance element of a semiconductor device according to Embodiment 3 along with four wiring layers extending from ends of the secondary coils;

FIG. 13 is a plan view for describing arrangement of a resistive field plate of a semiconductor device according to Embodiment 4;

FIG. 14 is a schematic partial cross-sectional view along the line XIV-XIV of FIG. 13;

FIG. 15 is a schematic partial cross-sectional view of a semiconductor device according to Embodiment 5;

FIG. 17 is a plan view illustrating arrangement in the in-plane direction of two second electrode plates of a signal conveyance element of a semiconductor device according to Embodiment 7 along with two wiring layers extending from ends of the second electrode plates;

FIG. 18 is a plan view illustrating arrangement in the in-plane direction of two first electrode plates of the signal conveyance element of the semiconductor device according to Embodiment 7 along with two wiring layers extending from ends of the first electrode plates;

FIG. 19 is a schematic partial cross-sectional view along the line XIX-XIX of FIG. 17;

FIG. 21 is a plan view illustrating arrangement in the in-plane direction of two first electrode plates of the signal conveyance element of the semiconductor device according to Embodiment 8 along with two wiring layers extending from ends of the first electrode plates.

DESCRIPTION OF THE PREFERRED EMBODIMENTS

Figure 1:
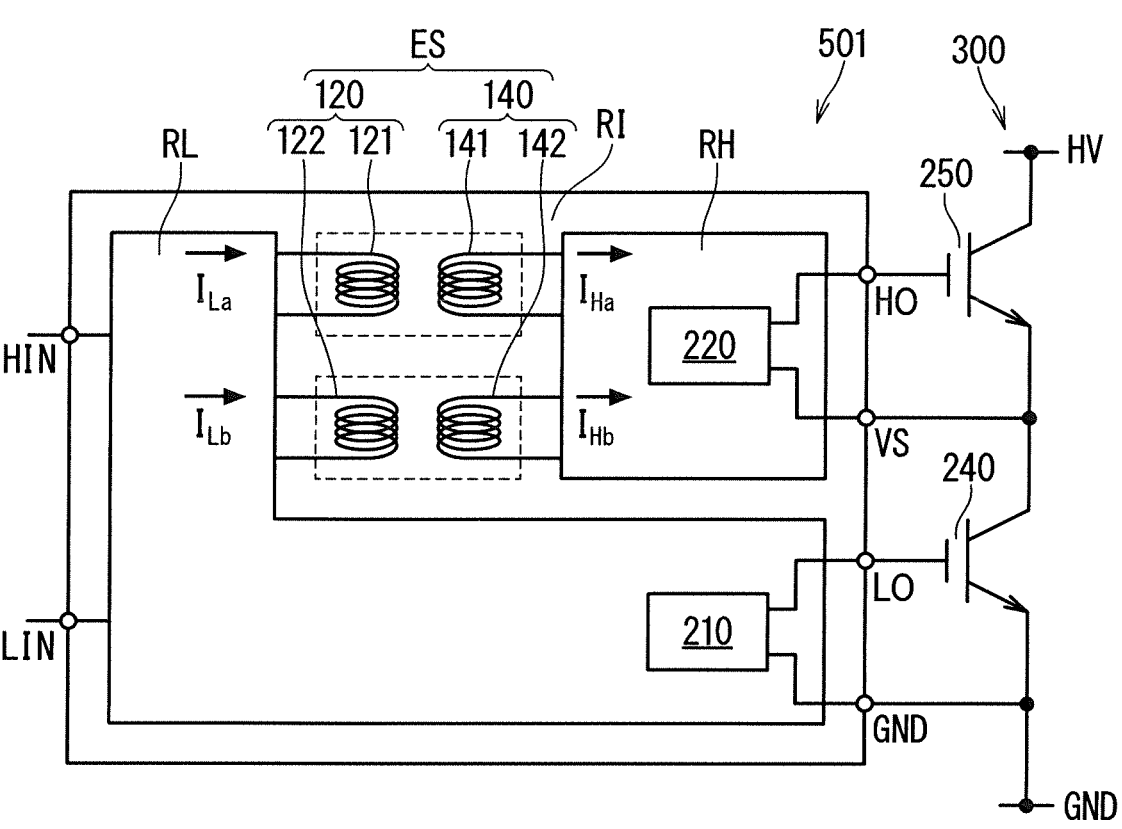
FIG. 1 is a schematic diagram showing a semiconductor device according to Embodiment 1 and a half bridge controlled by the semiconductor device.

Embodiments will be described below based on the drawings. The same or corresponding portions bear the same reference signs in the drawings shown below, and description thereof is not repeated.

Embodiment 1

FIG. 1 is a schematic diagram showing an HVIC 501 (a semiconductor device) according to Embodiment 1 and a half bridge 300 controlled by the HVIC 501. The half bridge 300 includes, between a ground potential GND and a high potential HV, a low side semiconductor switching element 240 and a high side semiconductor switching element 250 connected in series. The semiconductor switching element 240 and the semiconductor switching element 250 are each a power transistor having a gate. The semiconductor switching element 240 and the semiconductor switching element 250 are each an insulated gate bipolar transistor (IGBT) in an example shown in FIG. 1, so that the semiconductor switching element 240 and the semiconductor switching element 250 are also respectively referred to as a low side IGBT 240 and a high side IGBT 250.

The HVIC 501 includes a terminal for a low side input signal LIN, a terminal for a high side input signal HIN, a terminal for the ground potential GND, a terminal for a Coating potential VS between the semiconductor switching element 240 and the semiconductor switching element 250, a terminal for a low side output signal LO, and a terminal for a high side output signal HO also respectively referred to as a low side input terminal LIN, a high side input terminal HIN, a ground potential terminal GND, a floating potential terminal VS, a low side output terminal LO, and a high side output terminal HO. The low side output terminal LO and the high side output terminal HO are respectively connected to a gate of the low side semiconductor switching element 240 and a gate of the high side semiconductor switching element 250.

The HVIC 501 includes a low side drive circuit 210 (first drive circuit) and a high side drive circuit 220 (second drive circuit) to respectively generate the low side output signal LO and the high side output signal HO. The HVIC generates the low side output signal LO and the high side output signal HO respectively in response to the low side input signal LIN and the high side input signal HIN to control the half bridge 300. The low side drive circuit 210 and the high side drive circuit 220 are respectively arranged in a low side circuit region RL (first circuit region) and a high side circuit region RH (second circuit region). The low side circuit region RL and the high side circuit region RH are separated by an isolation region RI. A high voltage junction termination (HVJT) is disposed in the isolation region RI to secure a high breakdown voltage between the low side circuit region RL and the high side circuit region RH. A specific example of the high voltage junction termination will be described below.

The low side input signal LIN and the high side input signal HIN are received in the low side circuit region RL, so that it is necessary to convey these signals from the low side circuit region. RL to the high side circuit region RH to operate the high side drive circuit 220 in response to these signals, and the HVIC includes a signal conveyance element ES for the purpose. The signal conveyance element ES includes two primary coils 120 electrically connected to the low side circuit region RL and two secondary coils 140 electrically connected to the high side circuit region RH. Specifically, the signal conveyance element ES includes a primary coil 121 and a primary coil 122 as the two primary coils 120 and a secondary coil 141 and a secondary coil 142 as the two secondary coils 140. As indicated by dashed lines in FIG. 1, the primary coil 121 and the secondary coil 141 are magnetically coupled, and the primary coil 122 and the secondary coil 142 are magnetically coupled. The signal conveyance element ES conveys the signals using induced currents due to the magnetic couplings. The primary coils 120 and the secondary coils 140 are separated by an insulating film as described below, so that the signal conveyance element ES is an electrically insulating element except for conveying the above-mentioned induced currents. In other words, the signal conveyance element ES is an insulating element.

If the signal conveyance element ES is disposed in the low side circuit region RL, a portion of the low side circuit region RL where the signal conveyance element ES is disposed is difficult to be used for other purposes and is substantially an ineffective region in terms other than signal conveyance. This causes a problem in that a chip size of the HVIC might increase due to the need to secure a region in which the signal conveyance element ES is disposed. In contrast, the signal conveyance element ES is disposed in the isolation region RI in the present embodiment. The signal conveyance element ES and the high voltage junction termination can be arranged in the isolation region RI so that a position of the signal conveyance element ES in an in-plane direction and a position of the high voltage junction termination in the in-plane direction overlap each other by using a structure described in detail below. The signal conveyance element ES can thus be disposed in the isolation region RI without significantly increasing the size of the isolation region RI. The increase in chip size caused by disposing the signal conveyance element ES can thus be suppressed.

FIG. 2 is a signal waveform diagram showing a sequence of high side control performed by the HVIC 501 of FIG. 1. At a point in time when the high side input signal HIN transitions from low to high, a pulsed signal of a signal current $I_{La}$ is applied to the primary coil 121. The pulsed signal induces a signal current $I_{Ha}$ in the secondary coil 141. In response, the high side drive circuit 220 switches the high side output signal HO from low to high. On the other hand, at a point in time when the high side input signal HIN transitions from high to low, a pulsed signal of a signal current $I_{Lb}$ is applied to the primary coil 122. The pulsed signal induces a signal current $I_{Hb}$ in the secondary coil 142. In response, the high side drive circuit 220 switches the high side output signal HO from high to low. Due to the above-mentioned operation, the high side output signal HO can be restored in the high side circuit region RH in response to the high side input signal KIN received in the low side circuit region RL.

Figure 3:
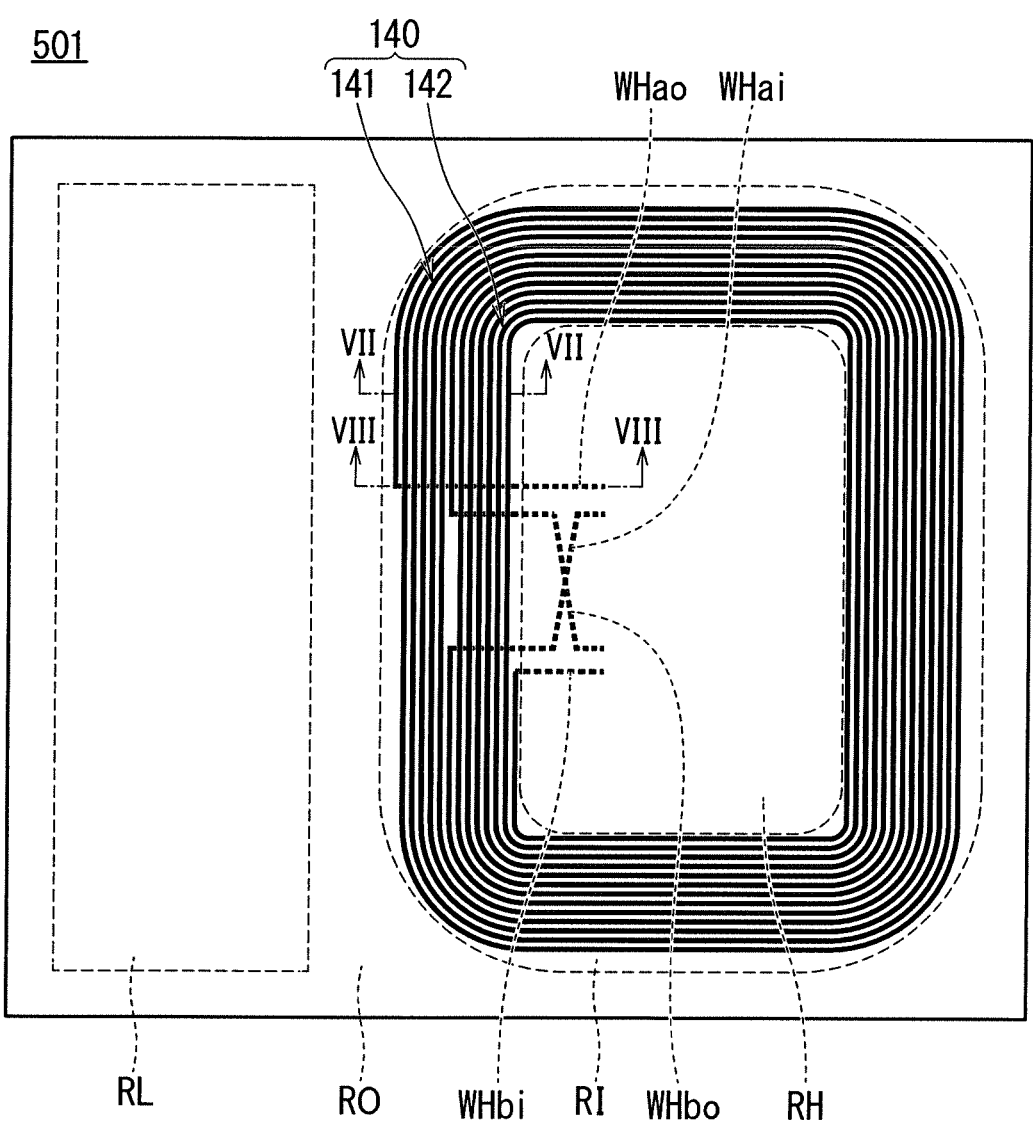
FIG. 3 is a plan view illustrating arrangement in an in-plane direction of two secondary coils of a signal conveyance element of the semiconductor device according to Embodiment 1 along with four wiring layers extending from ends of the secondary coils.
Figure 5:
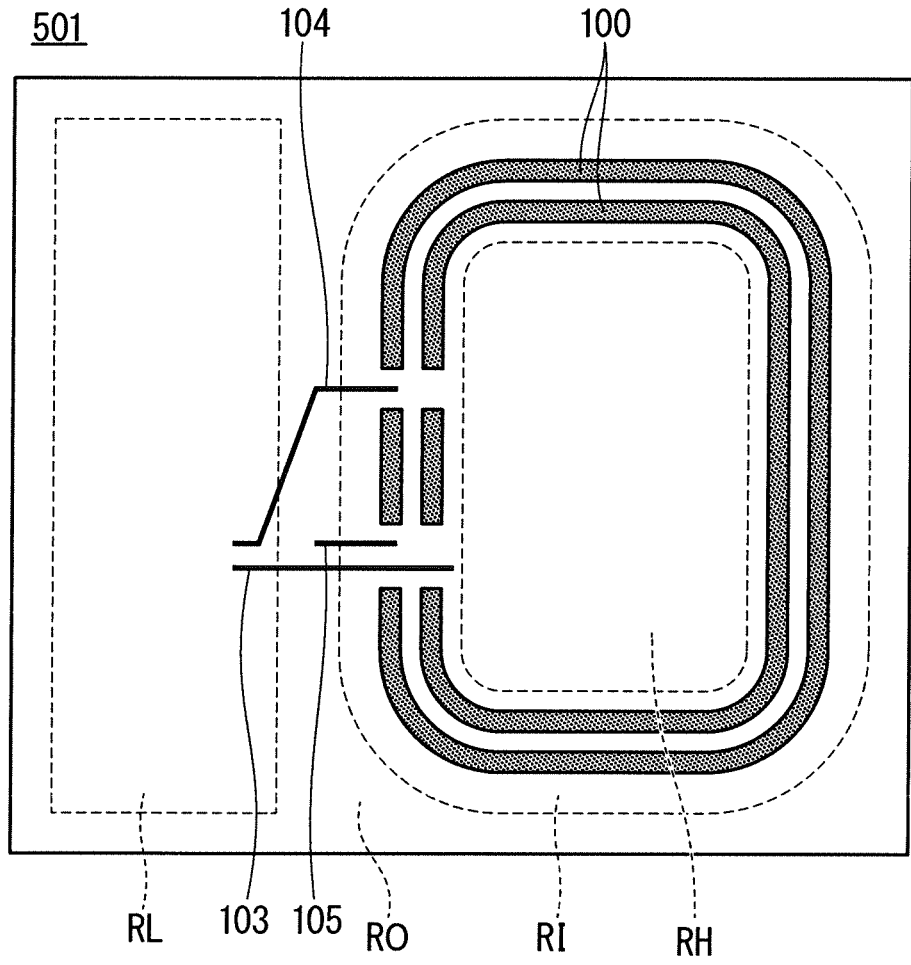
FIG. 5 is a plan view illustrating arrangement of metal wiring layers of a field plate of the semiconductor device according to Embodiment 1 along with arrangement of metal wiring layers for the primary coils arranged in a common layer.
Figure 7:
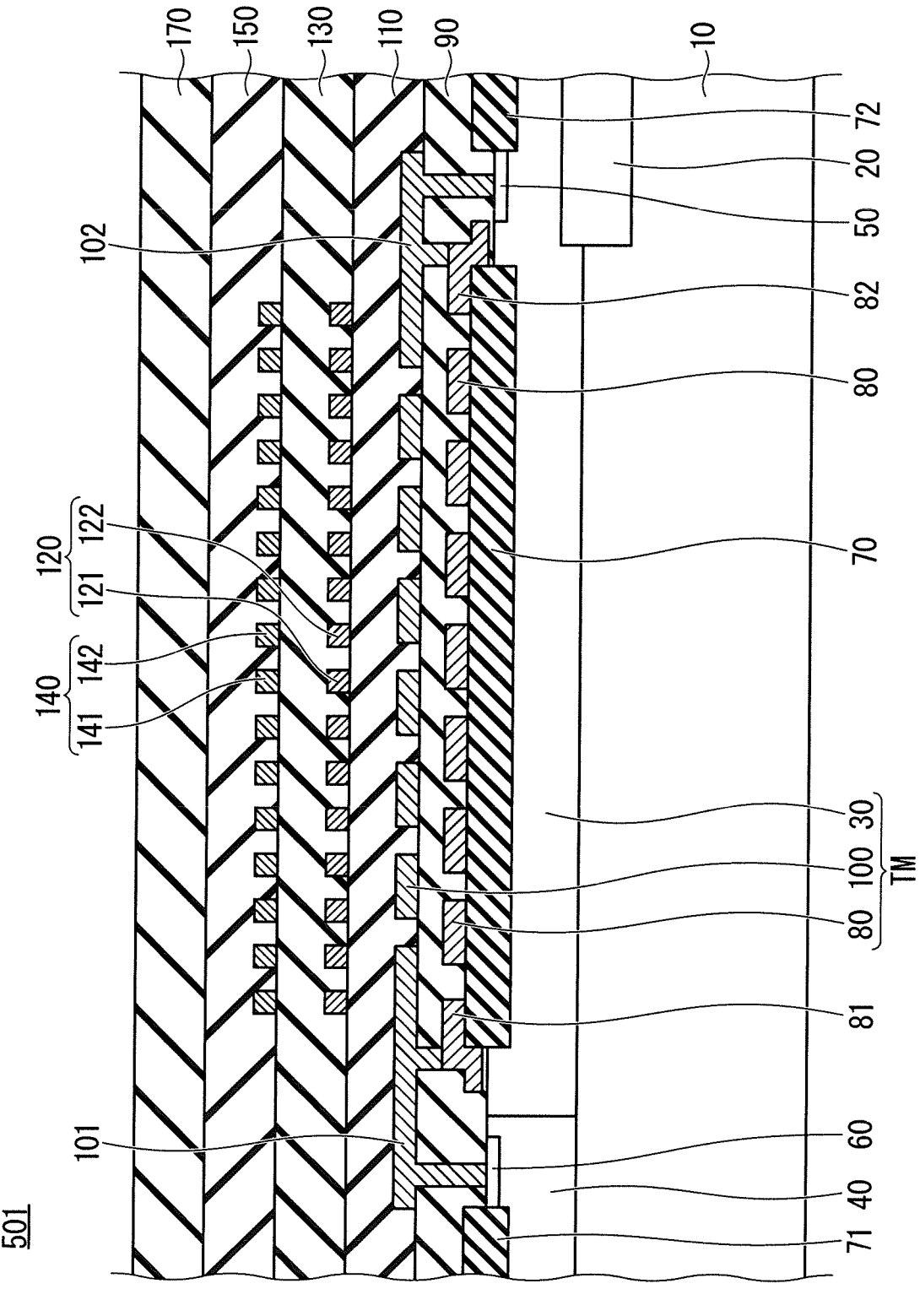
FIG. 7 is a schematic partial cross-sectional view along the line VII-VII of FIG. 3.
Figure 8:
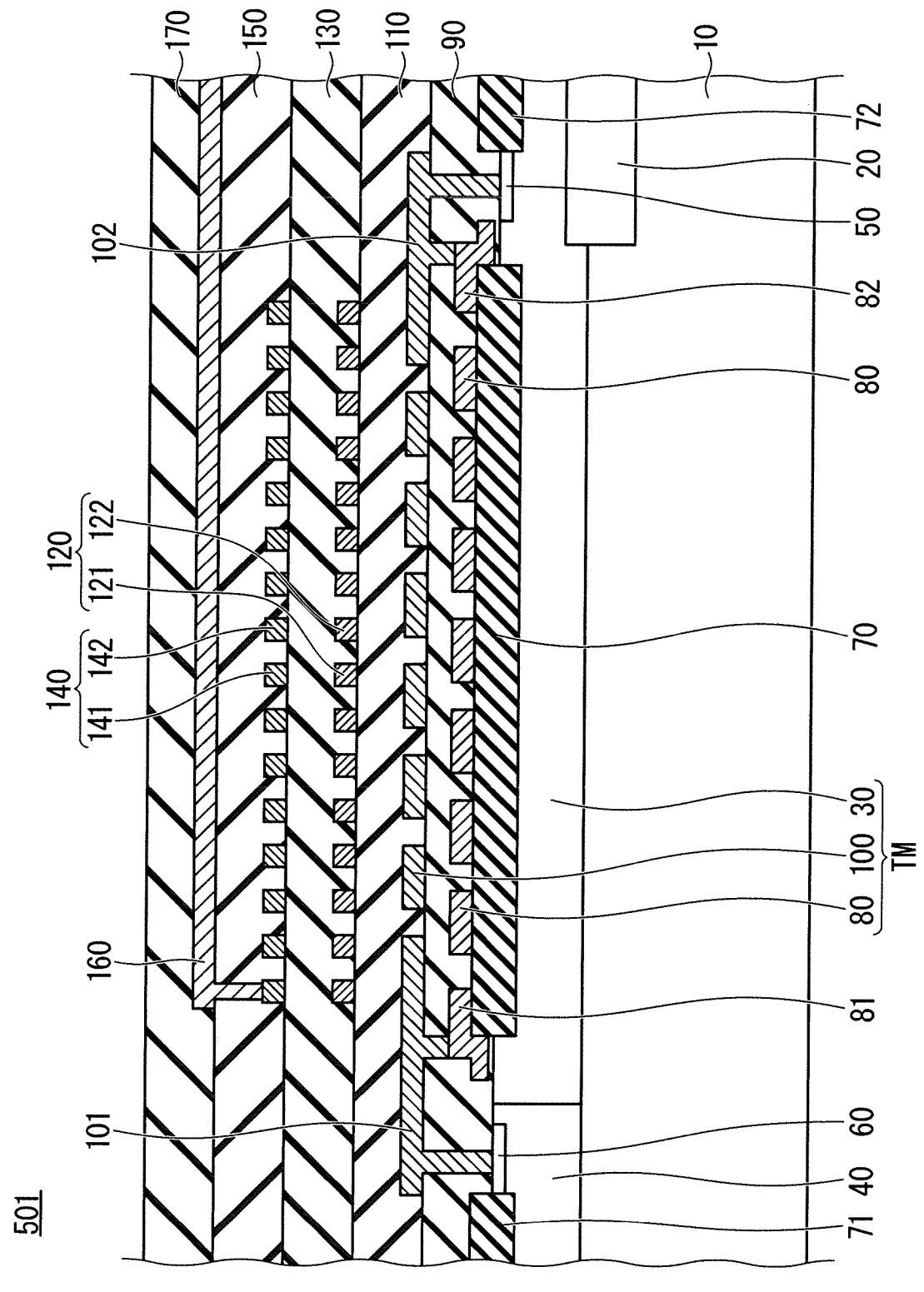
FIG. 8 is a schematic partial cross-sectional view along the line VIII-VIII of FIG. 3.
Figure 9:
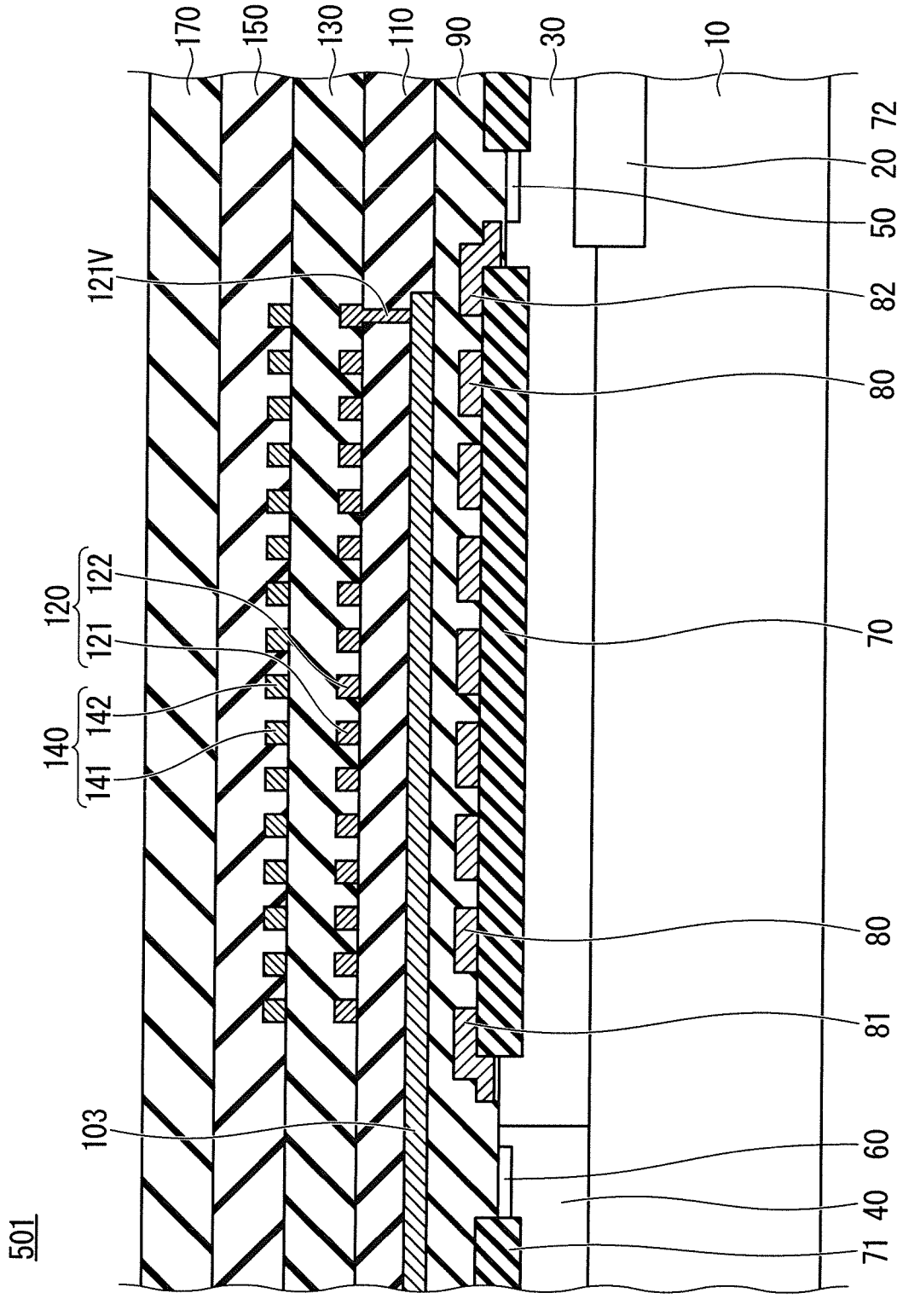
FIG. 9 is a schematic partial cross-sectional view along the line IX-IX of FIG. 4.

A structure of the HVIC 501 will be further described with reference to FIGS. 3 to 9 although partially overlapping the above-mentioned description. FIG. 3 is a plan view illustrating arrangement in the in-plane direction of the two secondary coils 140 of the HVIC 501 along with four wiring layers (parts indicated by thick dashed lines in FIG. 3) extending from ends of the secondary coils 140. FIG. 4 is a plan view illustrating arrangement in the in-plane direction of the two primary coils 120 of the HVIC along with four wiring layers (parts indicated by thick dashed lines in FIG. 4) extending from ends of the primary coils 120. FIG. 5 is a plan view illustrating arrangement of metal wiring layers 100 of a field plate of the HVIC 501 along with metal wiring layers for the primary coils 120 arranged in a common layer. FIG. 6 is a plan view illustrating arrangement of polysilicon layers 80 of the field plate of the HVIC 501. FIGS. 7, 8, and 9 are schematic partial cross-sectional views respectively along the line VII-VII (FIG. 3), the line VIII-VIII (FIG. 3), and the line IX-IX (FIG. 4).

As illustrated in FIGS. 3 to 6, the HVIC 501 has the low side circuit region RL (first circuit region), the high side circuit region RH (second circuit region), and the isolation region RI separating the low side circuit region RL and the high side circuit region RH. The low side circuit region RL is a region in which a circuit having a reference potential as the ground potential GND is disposed. The high side circuit region RH is a region in which a circuit having a reference potential as the floating potential VS electrically separated from the ground potential GND is disposed. The isolation region RI surrounds an outer periphery of the high side circuit region RH. The low side drive circuit 210 is disposed in the low side circuit region RL, and the high side drive circuit 220 is disposed in the high side circuit region RH. The low side drive circuit 210 has the reference potential (a first reference potential) as the ground potential GND, and the high side drive circuit 220 has the reference potential (a second reference potential) as the floating potential VS electrically separated from the ground potential GND. During operation of the HVIC 501, a voltage between the ground potential GND and the floating potential VS varies and has a maximum value of 100 V or more and 2000 V or less, for example. In other words, a voltage between the ground potential GND and the high potential HV (FIG. 1) is 100 V or more and 2000 V or less, for example. In the present description, "a circuit having a reference potential" means that the circuit is operably configured to use the reference potential".

The high voltage junction termination TM is disposed in the isolation region RI to secure a breakdown voltage between the low side circuit region RL and the high side circuit region RH. The breakdown voltage is 100 V or more and 2000 V or less, for example, in response to the above-mentioned example of the voltage. The high voltage junction termination TM includes a resurf isolation structure with the field plate in the present embodiment. The field plate is disposed below the signal conveyance element ES (FIG. 1) including the primary coils 120 and the secondary coils (FIG. 7), and the resurf isolation structure is disposed below the field plate. In other words, the field plate is disposed between the signal conveyance element ES and the resurf isolation structure. The field plate thus shields the effect of the signals conveyed by the signal conveyance element ES on the resurf isolation structure. Reduction in breakdown voltage of the HVIC 501 due to the signals conveyed from the low side circuit region RL to the high side circuit region RH can thus be suppressed.

The resurf isolation structure is formed by forming an n-type epitaxial layer 30 meeting a resurf condition over a p-type substrate 10. A p-type diffusion layer 40 is also formed over the p-type substrate 10 to surround the high side circuit region RH (a region on a right side of FIG. 7) and the n-type epitaxial layer 30 around the high side circuit region RH. As a modification of the resurf isolation structure, an n-type diffusion layer may be formed in place of the n-type epitaxial layer 30. Specifically, a p-type epitaxial layer may be formed over the p-type substrate 10, and the n-type diffusion layer may be formed in a surface of the p-type epitaxial layer. The field plate is disposed over the n-type epitaxial layer 30 forming the resurf isolation structure via a thermal oxide film 70 (an insulating film). The field plate includes the polysilicon layers 80 over the thermal oxide film 70 and the metal wiring layers 100 in the present embodiment. The polysilicon layers 80 and the metal wiring layers 100 oppose each other with an insulating layer 90 therebetween to form a capacitance. The field plate is thus a capacitive field plate.

Elements that can accompany the above-mentioned high voltage junction termination TM will be described in more detail. An n$^+$ buried diffusion layer 20 is disposed inward (to the right in FIG. 7) of an end (a right end in FIG. 7) of the p-type diffusion layer 40 to be in contact with a lower surface of the n-type epitaxial layer 30. In a case where the p-type epitaxial layer is formed over the p-type substrate 10, and the n-type diffusion layer is formed in the surface of the p-type epitaxial layer as the above-mentioned modification of the resurf isolation structure, the n$^+$ buried diffusion layer 20 is disposed to be in contact with a lower surface of the p-type epitaxial layer. The n$^+$ buried diffusion layer 20 is particularly beneficial when the n-type epitaxial layer 30 has a thickness of less than 10 μm. The n$^+$ buried diffusion layer 20 has the highest impurity concentration, followed in order by the p-type diffusion layer 40, the n-type epitaxial layer 30, and the p-type substrate 10.

An n$^+$ diffusion layer 50 to provide good electrical contact between the n-type epitaxial layer 30 and a metal wiring layer 102 is formed in a portion of a surface of the n-type epitaxial layer 30 spaced a distance apart from the p-type diffusion layer 40. A p$^+$ diffusion layer 60 to provide good electrical contact between the p-type diffusion layer 40 and a metal wiring layer 101 is formed in a portion of a surface of the p-type diffusion layer 40.

The thermal oxide film 70 (FIG. 7) formed in the surface of the n-type epitaxial layer 30 is located between the p-type diffusion layer 40 and the n$^+$ diffusion layer 50. A polysilicon layer 81 and a polysilicon layer 82 are formed to respectively cover one end and the other end of the thermal oxide film 70. In an example illustrated in FIG. 7, the polysilicon layer 81 and the polysilicon layer 82 each include a portion located over an upper surface of the thermal oxide film 70 and a portion being in contact with a side surface of the thermal oxide film 70 while being separated from the n-type epitaxial layer 30 by a thin insulating layer. As a modification, only one of these portions may be formed. The above-mentioned thin insulating layer may be formed simultaneously in a step of forming a gate insulating film in the manufacture of the HVIC 501. The polysilicon layer 81 and the polysilicon layer 82 are spaced a distance apart from each other. A plurality of patterns of the polysilicon layers 80 are discretely arranged at regular intervals over a portion of the thermal oxide film 70 between the polysilicon layer 81 and the polysilicon layer 82 (see FIG. 7) and each surround the high side circuit region RH (see FIG. 6). The polysilicon layers 80, the polysilicon layer 81, and the polysilicon layer 82 are covered with the insulating layer 90.

The metal wiring layer 101 and the metal wiring layer 102 are formed over the insulating layer 90. The metal wiring layer 101 is electrically connected to the p$^+$ diffusion layer 60 and the polysilicon layer 81 through contact holes formed in the insulating layer 90. The metal wiring layer 102 is electrically connected to the n$^+$ diffusion layer 50 and the polysilicon layer 82 through contact holes formed in the insulating layer 90.

A plurality of patterns of the metal wiring layers 100 are formed at regular intervals without being electrically connect to each other over a portion of the insulating layer 90 between the metal wiring layer 101 and the metal wiring layer 102 (see FIG. 7) and each surround the high side circuit region RH (see FIG. 5). The patterns of the metal wiring layers 100 are arranged to overlap the patterns of the polysilicon layers 80 with a width. The polysilicon layers 80 and the metal wiring layers 100 are thus capacitively coupled via the insulating layer 90. These metal wiring layers 100 to 102 over the insulating layer 90 are covered with an insulating layer 110.

The high voltage junction termination TM according to Embodiment 1 and the elements accompanying the high voltage junction termination TM have been described above.

The signal conveyance element ES (FIG. 1) will be described next. The signal conveyance element ES is an element to convey the signals from the low side circuit region RL to the high side circuit region RH. In the present embodiment, the signal conveyance element ES includes the two primary coils 120 and the two secondary coils 140 as described above.

The two primary coils 120, that is, the primary coil 121 and the primary coil 122 each have opposite ends electrically connected to the low side circuit region RL as illustrated in FIG. 4. The primary coil 121 and the primary coil 122 are arranged in the isolation region RI. The primary coil 121 and the primary coil 122 are each formed over the insulating layer 110 in a spiral to surround the outer periphery of the high side circuit region RH. The primary coil 122 is disposed between the primary coil 121 and the high side circuit region RH. The primary coil 121 and the primary coil 122 are covered with an interlayer insulating film 130.

The two secondary coils 140, that is, the secondary coil 141 and the secondary coil 142 each have opposite ends electrically connected to the high side circuit region RH as illustrated in FIG. 3. The secondary coils 140 are separated from the two primary coils 120 by the interlayer insulating film 130. The secondary coil 141 and the secondary coil 142 are arranged in the isolation region RI to respectively be magnetically coupled to the primary coil 121 and the primary coil 122. The secondary coil 141 and the secondary coil 142 are each formed over the interlayer insulating film 130 in a spiral to surround the outer periphery of the high side circuit region RH. The secondary coil 142 is disposed between the secondary coil 141 and the high side circuit region RH. An insulating layer 150 is formed to cover the secondary coil 141 and the secondary coil 142 over interlayer insulating film 130.

The primary coil 121 and the primary coil 122 (FIG. 4) each have a coil axis in the high side circuit region RH. Similarly, the secondary coil 141 and the secondary coil 142 (FIG. 3) each have a coil axis in the high side circuit region RH. In the present description, a "coil axis" refers to an imaginary axis for a winding of a coil. In an example illustrated in FIGS. 3 and 4, each coil is disposed to surround the high side circuit region RH along an edge of the high side circuit region RH, and thus it is self-evident that the coil axis is located in the high side circuit region RH. To exactly determine a position of the coil axis, for each coil, an average position of conductor patterns substantially constituting the coil is calculated, for example.

As illustrated in FIG. 3, a wiring layer WHao and a wiring layer WHai respectively extend from an outer end and an inner end of the secondary coil 141 to the high side circuit region RH to electrically connect the secondary coil 141 and the high side circuit region RH. Similarly, a wiring layer WHbo and a wiring layer WHbi respectively extend from an outer end and an inner end of the secondary coil 142 to the high side circuit region RH to electrically connect the secondary coil 142 and the high side circuit region RH. The outer end of the secondary coil 141 falls outside a range in which the metal wiring layers 100 constituting the field plate are discretely distributed and is located outward (to the left in FIG. 7) of the range in the in-plane direction. The inner end of the secondary coil 142 falls outside the range in which the metal wiring layers 100 constituting the field plate are discretely distributed and is located inward (to the right in FIG. 7) of the range in the in-plane direction. The inner end of the secondary coil 141 and the outer end of the secondary coil 142 are located in a range between the metal wiring layer 101 and the metal wiring layer 102 in the in-plane direction (see positions bearing the reference signs 140 to 142 in FIG. 7). To illustrate a wiring structure, the wiring layer WHao includes a metal wiring layer 160 (FIG. 8), and the wiring layer WHai includes a metal wiring layer disposed in a common layer with the metal wiring layer 160 (FIG. 8). These metal wiring layers are connected to the secondary coil 141 through contact holes formed in the insulating layer 150. The plurality of metal wiring layers arranged in the common layer can be formed simultaneously in the manufacture, and the same applies to the other metal wiring layers. The wiring layer WHbo includes a portion connected to the secondary coil 142, and the portion includes a metal wiring layer disposed in a common layer with the metal wiring layer 160 (FIG. 8) and is connected to the secondary coil 142 through a contact hole formed in the insulating layer 150. The wiring layer WHbo further includes a portion connected to the high side circuit region RH, and the portion includes a metal wiring layer disposed in a common layer with the secondary coil 142. The wiring layer WHbi includes metal wiring disposed in the common layer with the secondary coil 142. The metal wiring layer 160 (and the other metal layers in the common layer) over the insulating layer 150 is covered with an insulating layer 170.

As illustrated in FIG. 4, a wiring layer WLao and a wiring layer WLai respectively extend from an outer end and an inner end of the primary coil 121 to the low side circuit region RL to electrically connect the primary coil 121 and the low side circuit region RL. Similarly, a wiring layer WLbo and a wiring layer WLbi respectively extend from an outer end and an inner end of the primary coil 122 to the low side circuit region RL to electrically connect the primary coil 122 and the low side circuit region RL. The outer end of the primary coil 121 falls outside the range in which the metal wiring layers 100 constituting the field plate are discretely distributed and is located outward (to the left in FIG. 7) of the range in the in-plane direction. The inner end of the primary coil 122 falls outside the range in which the metal wiring layers 100 constituting the field plate are discretely distributed and is located inward (to the right in FIG. 7) of the range in the in-plane direction. The inner end of the primary coil 121 and the outer end of the primary coil 122 are located in the range between the metal wiring layer 101 and the metal wiring layer 102 in the in-plane direction (see positions bearing the reference signs 120 to 122 in FIG. 7). To illustrate a wiring structure, the wiring layer WLao includes a metal wiring layer disposed in a common layer with the primary coil 121. A portion of the wiring layer WLai connected to the primary coil 121 includes a metal wiring layer 105 (FIG. 5) disposed in a common layer with the metal wiring layers 100 for the field plate, and a portion of the wiring layer WLai connected to the low side circuit region RL includes a metal wiring layer disposed in the common layer with the primary coil 121. The primary coil 121 is connected to the metal wiring layer 105 through a contact hole formed in the insulating layer 110. The wiring layer WLbo includes a metal wiring layer 104 (FIG. 5) disposed in the common layer with the metal wiring layers 100 for the field plate. The wiring layer WLbi includes a metal wiring layer 103 (FIG. 5) disposed in the common layer with the metal wiring layers 100 for the field plate. The primary coil 122 is connected to the metal wiring layer 103 and the metal wiring layer 104 through contact holes formed in the insulating layer 110.

Embodiment 2

Figure 10:
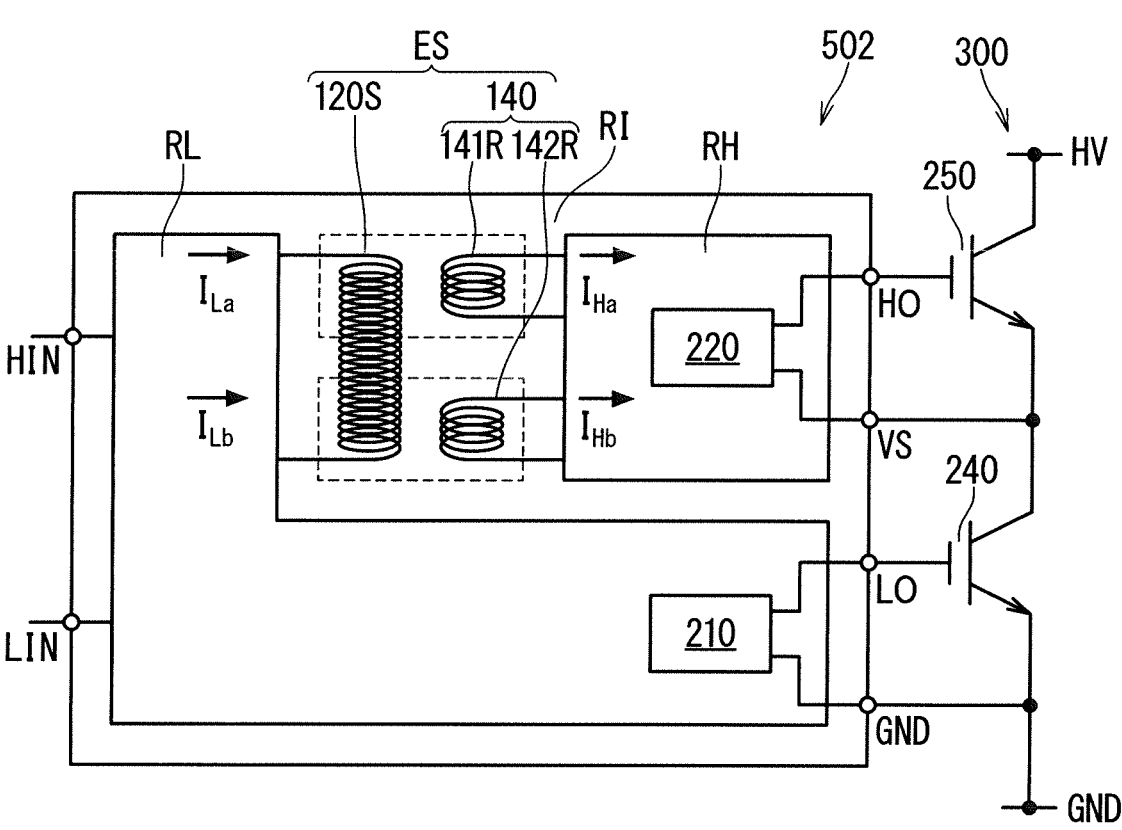
FIG. 10 is a schematic diagram showing a configuration of a half bridge and a semiconductor device to drive the half bridge according to Embodiment 2.

FIG. 10 is a schematic diagram showing a configuration of the half bridge 300 and an HVIC (the semiconductor device) 502 to drive the half bridge 300 according to Embodiment 2. In Embodiment 2, the signal conveyance element ES includes a single primary coil 120S (FIG. 10) in place of the two primary coils 120, that is, the primary coil 121 and the primary coil 122 (FIG. 1: Embodiment 1). The signal conveyance element ES also includes, as the two secondary coils 140, a secondary coil 141R and a secondary coil 142R having opposite winding directions in place of the secondary coil 141 and the secondary coil 142 (FIG. 1: Embodiment 1). The primary coil 120S is disposed to be magnetically coupled to each of the secondary coil 141R and the secondary coil 142R.

At each of the point in time when the high side input signal HIN (FIG. 2) transitions from low to high and the point in time when the high side input signal HIN transitions from high to low, an on pulsed signal and an off pulsed signal corresponding to opposite currents are generated in the low side circuit region RL and applied to the primary coil 120S. When the secondary coil 141R receives the on pulsed signal, the high side drive circuit 220 switches the high side output signal HO from low to high. On the other hand, when the secondary coil 142R receives the off pulsed signal, the high side drive circuit 220 switches the high side output signal HO from high to low. Due to the above-mentioned operation, the high side output signal HO can be restored in the high side circuit region RH in response to the high side input signal HIN received in the low side circuit region RL.

A configuration other than the above-mentioned configuration is substantially the same as the above-mentioned configuration in Embodiment 1, so that the same or corresponding elements bear the same reference signs, and description thereof is not repeated. A substantially similar effect to that obtained in Embodiment 1 is obtained in Embodiment 2. Features in Embodiment 2 are applicable to Embodiments 3 to 6 described below.

According to Embodiment 2, due to the use of the single primary coil 120S, a greater number of turns of the primary coil 120S is likely to be secured compared with the number of turns of each of the primary coils 120 (FIG. 1: Embodiment 1). Sensitivity of signal conveyance can thereby be increased.

Embodiment 3

Figure 12:
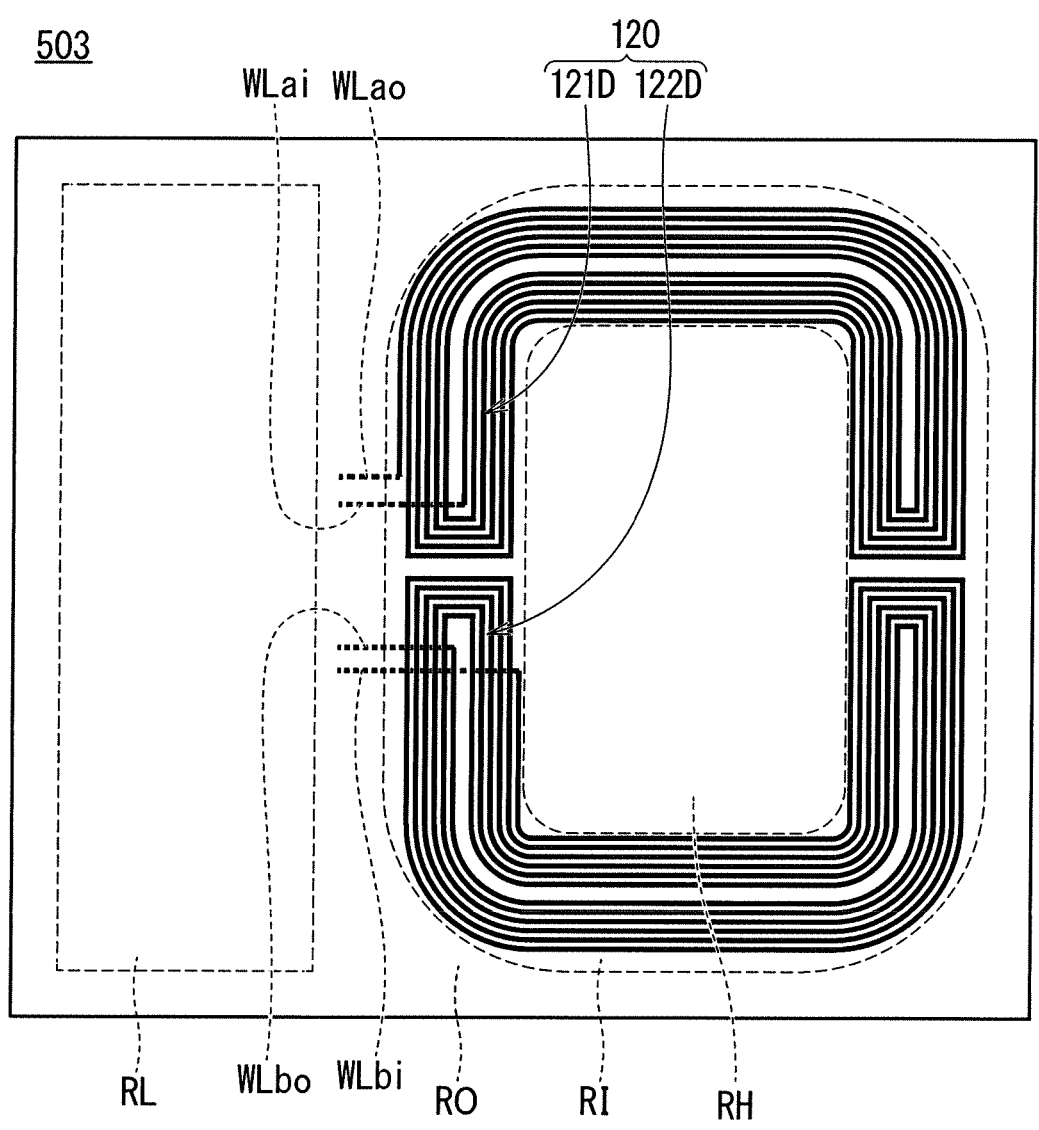
FIG. 12 is a plan view illustrating arrangement in the in-plane direction of two primary coils of the signal conveyance element of the semiconductor device according to Embodiment 3 along with four wiring layers extending from ends of the primary coils.

FIG. 11 is a plan view illustrating arrangement in the in-plane direction of the two secondary coils 140 of the signal conveyance element ES of an HVIC 503 (the semiconductor device) according to Embodiment 3 along with four wiring layers (parts indicated by thick dashed lines in FIG. 11) extending from ends of the secondary coils 140. FIG. 12 is a plan view illustrating arrangement in the in-plane direction of the two primary coils 120 of the signal conveyance element ES of the HVIC 503 according to Embodiment 3 along with four wiring layers (parts indicated by thick dashed lines in FIG. 12) extending from ends of the primary coils 120.

In Embodiment 3, the two secondary coils 140 include a secondary coil 141D and a secondary coil 142D (FIG. 11), and the two primary coils 120 include a primary coil 121D and a primary coil 122D (FIG. 12). The primary coil 121D, the primary coil 122D, the secondary coil 141D, and the secondary coil 142D are each wound to be folded back in the middle without completely surrounding a periphery of the high side circuit region RH in contrast to the primary coil 121, the primary coil 122, the secondary coil 141, and the secondary coil 142 in Embodiment 1. Specifically, in an example illustrated in FIGS. 11 and 12, each coil includes, in large part, a linear portion extending along the outer periphery of the high side circuit region RH but includes a portion extending along a direction intersecting the outer periphery, and wiring is folded back via the portion. As a result of a configuration as described above, the primary coil 121D, the primary coil 122D, the secondary coil 141D, and the secondary coil 142D each have a coil axis in the isolation region RI in contrast to Embodiment 1.

Furthermore, as can be seen from comparison between FIG. 3 (Embodiment 1) and FIG. 11 (Embodiment 3), a wiring design to avoid intersection of the wiring layer WHai and the wiring layer WHbo in the in-plane direction is likely to be used according to Embodiment 3. Similarly, as can be seen from comparison between FIG. 4 (Embodiment 1) and FIG. 12 (Embodiment 3), intersection of the wiring layer WLai and the wiring layer WLbo in the in-plane direction is likely to be avoided. A structure of these wiring layers can thus be simplified. An example of the wiring structure will be described below.

The wiring layer WHao and the wiring layer WHai (FIG. 11: Embodiment 3) respectively include the metal wiring layer 160 (FIG. 8) and the metal wiring disposed in the common layer with the metal wiring layer 160 as in a case of the wiring layer WHao and the wiring layer WHai (FIG. 3: Embodiment 1). The wiring layer WHbi (FIG. 11: Embodiment 3) is disposed in a common layer with the secondary coil 142D (FIG. 11) or the secondary coil 142 (FIG. 3) as in a case of the wiring layer WHbi (FIG. 3: Embodiment 1). On the other hand, the wiring layer WHbo (FIG. 3: Embodiment 1) intersects the wiring layer WHai in the in-plane direction and thus complicatedly includes the metal wiring layer disposed in the common layer with the metal wiring layer 160 (FIG. 8) and the metal wiring layer disposed in the common layer with the secondary coil 142, whereas the wiring layer WHbo (FIG. 11: Embodiment 3) does not intersect the wiring layer WHai in the in-plane direction and thus can include the metal wiring layer disposed in the common layer with the metal wiring layer 160 (FIG. 8) without including the metal wiring layer disposed in the common layer with the secondary coil 142.

A configuration other than the above-mentioned configuration is substantially the same as the above-mentioned configuration in Embodiment 1, so that the same or corresponding elements bear the same reference signs, and description thereof is not repeated. A substantially similar effect to that obtained in Embodiment 1 is obtained in Embodiment 3. Features in Embodiment 3 are applicable to the other embodiments described below.

According to Embodiment 3, first, a magnetic field is generated mainly in the isolation region RI as each coil axis is in the isolation region RI. An effect of the magnetic field on a circuit disposed in the high side circuit region RH can thus be reduced. Second, a region in which a pair of the primary coil 121D (FIG. 12) and the secondary coil 141D (FIG. 11), that is, a first coil pair (see an upper region indicated by a dashed line in FIG. 1) is disposed and a region in which a pair of the primary coil 122D (FIG. 12) and the secondary coil 142D (FIG. 11), that is, a second coil pair (see a lower region indicated by a dashed line in FIG. 1) is disposed can be arranged away from each other in the in-plane direction. For example, the first coil pair is disposed in an upper half region of the isolation region RI, and the second coil pair is disposed in a lower half region of the isolation region RI in FIGS. 11 and 12. This can suppress magnetic couplings between different coil pairs unnecessary for signal conveyance.

Embodiment 4

Figure 14:
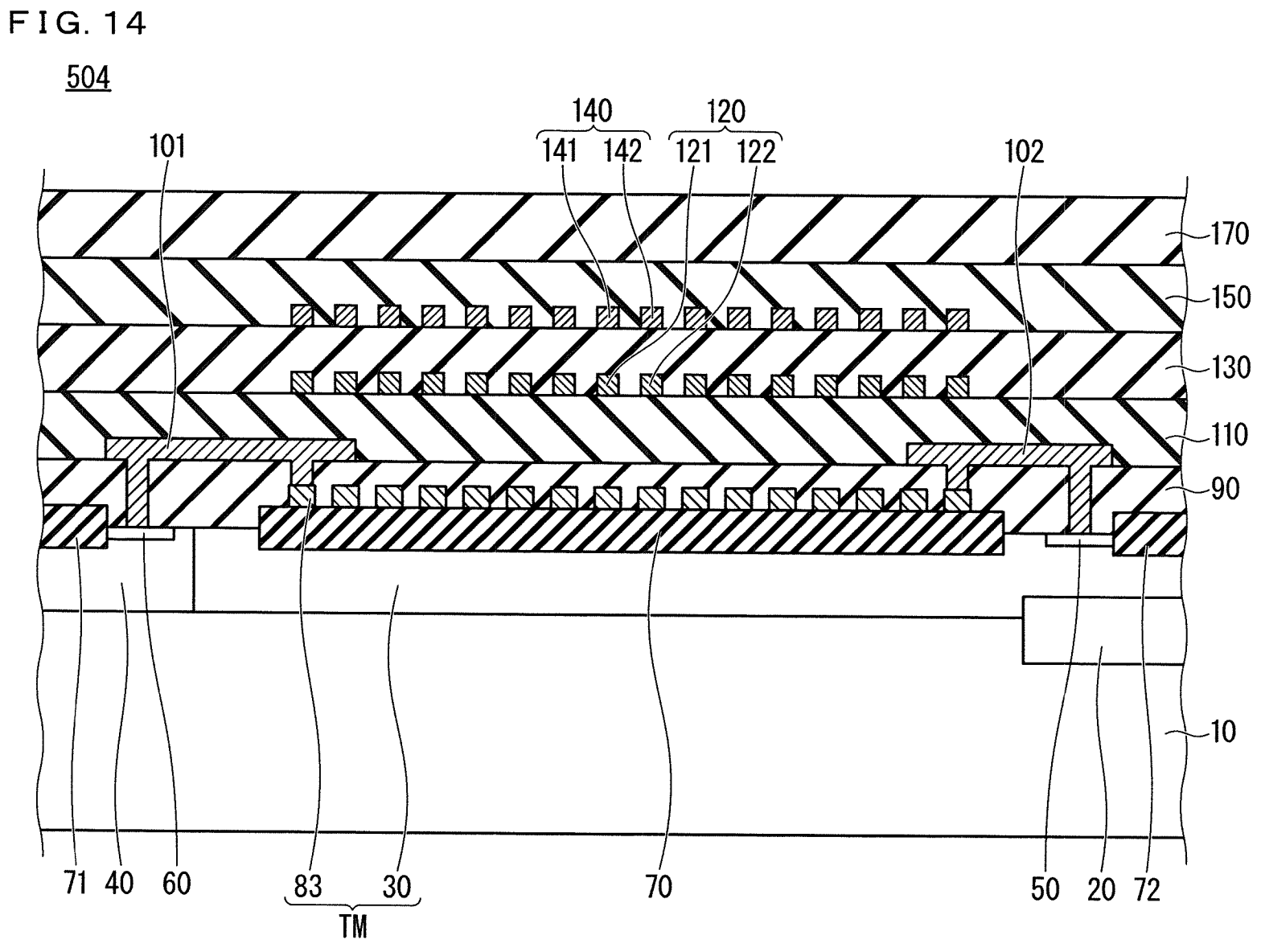

FIG. 13 is a plan view for describing arrangement of a resistive field plate 83 of an HVIC 504 (the semiconductor device) according to Embodiment 4. FIG. 14 is a schematic partial cross-sectional view along the line XIV-XIV of FIG. 13.

The high voltage junction termination TM (FIG. 14: Embodiment 4) of the HVIC 504 includes, as a field plate, a polysilicon layer 83 as the resistive field plate 83 over the thermal oxide film 70 in place of the capacitive field plate (FIG. 7: Embodiment 1) including the polysilicon layers 80 and the metal wiring layers 100. An insulating film not being a thermal oxide film may be disposed between the polysilicon layer 83 and the thermal oxide film 70. The resistive field plate 83 has a spiral shape in the in-plane direction. An outer end of the resistive field plate 83 is connected to the low side circuit region RL through the metal wiring layer 101. An inner end of the resistive field plate 83 is connected to the high side circuit region RH through the metal wiring layer 102.

Arrangement of the metal wiring layer 101 in Embodiment 4 may be similar to arrangement of the metal wiring layer 101 in Embodiment 1 except that the metal wiring layer 101 is connected to the outer end of the polysilicon layer 83 instead of being connected to the polysilicon layer 81 (FIG. 7: Embodiment 1). Arrangement of the metal wiring layer 102 in Embodiment 4 may also be similar to arrangement of the metal wiring layer 102 in Embodiment 1 except that the metal wiring layer 102 is connected to the inner end of the polysilicon layer 83 instead of being connected to the polysilicon layer 82 (FIG. 7: Embodiment 1).

A configuration other than the above-mentioned configuration is substantially the same as the above-mentioned configuration in Embodiment 1, so that the same or corresponding elements bear the same reference signs, and description thereof is not repeated. A substantially similar effect to that obtained in Embodiment 1 is obtained in Embodiment 4. Features in Embodiment 4 are applicable to the other embodiments described below.

According to Embodiment 4, the high voltage junction termination TM includes the resistive field plate, so that a breakdown voltage in the isolation region RI can be stabilized by fixing a potential gradient on the isolation region RI by resistive division.

Embodiment 5

FIG. 15 is a schematic partial cross-sectional view of an HVIC 505 (the semiconductor device) according to Embodiment 5. The high voltage junction termination TM of the HVIC 505 includes a trench isolation structure 180 in place of the resurf isolation structure described in Embodiment 1. The trench isolation structure 180 includes trenches formed in a semiconductor member and dielectric portions (i.e., insulator portions) filling the trenches or polysilicon portions filling the trenches via insulating layers. The trench isolation structure 180 extends from a bottom surface of the thermal oxide film 70 into the semiconductor member along a thickness direction. The semiconductor member is the p-type substrate 10 over which the n-type epitaxial layer 30 is disposed in an example illustrated in FIG. 15. The trench isolation structure 180 extends through the n-type epitaxial layer 30 to the p-type substrate 10 and may penetrate into the p-type substrate 10. The semiconductor member including the n-type epitaxial layer 30 and the p-type substrate 10 as a whole can be considered a silicon single crystal and is thus a kind of a silicon single crystalline wafer.

A configuration other than the above-mentioned configuration is substantially the same as the above-mentioned configuration in Embodiment 1, so that the same or corresponding elements bear the same reference signs, and description thereof is not repeated. A substantially similar effect to that obtained in Embodiment 1 is obtained in Embodiment 5.

According to Embodiment 5, the high voltage junction termination TM includes the trench isolation structure 180, so that a size of the isolation region RI necessary to dispose the high voltage junction termination TM can be reduced, and a leakage current between the high side circuit region RH and the low side circuit region RL can be reduced.

Embodiment 6

Figure 16:
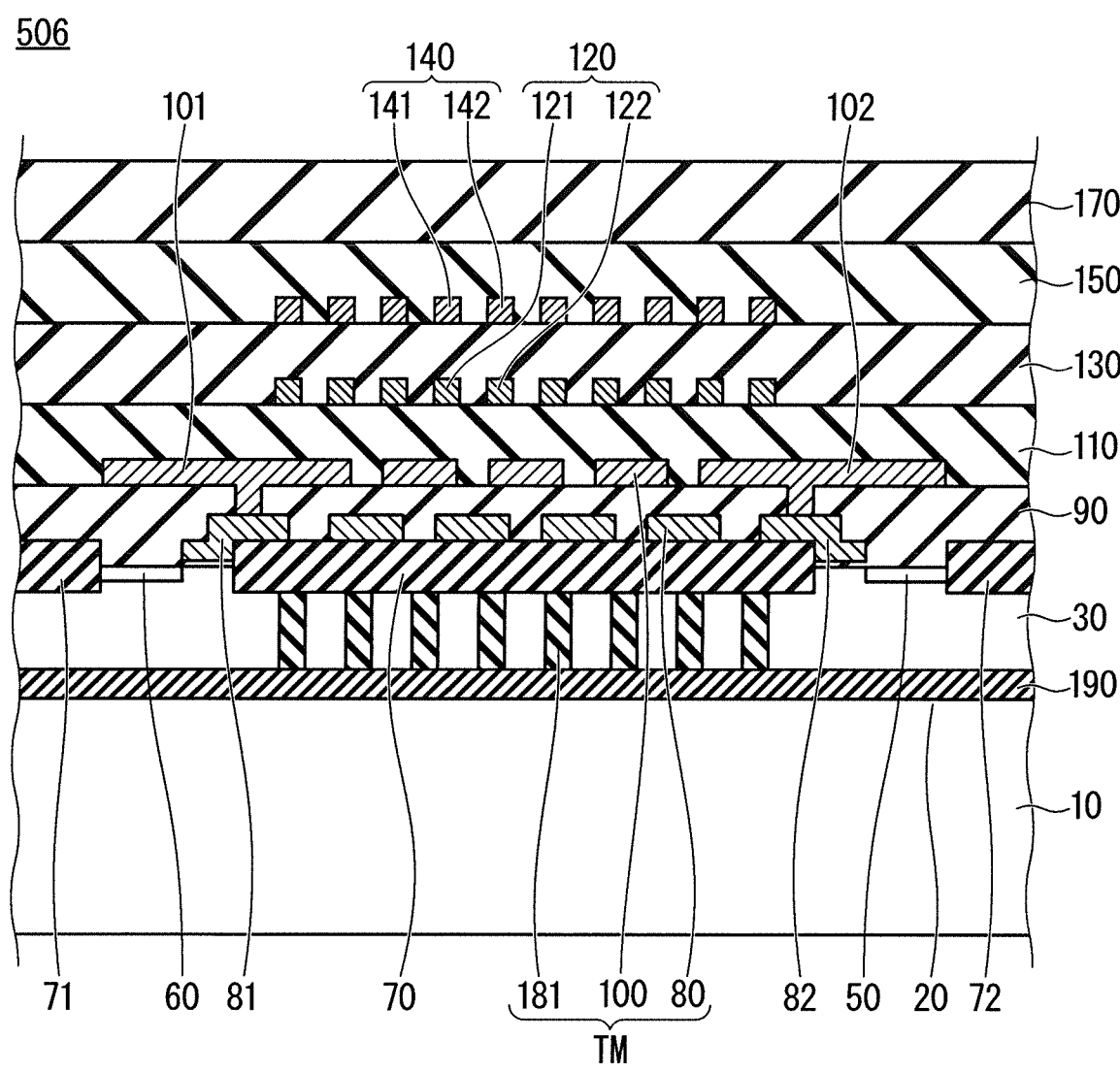
FIG. 16 is a schematic partial cross-sectional view of a semiconductor device according to Embodiment 6.

FIG. 16 is a schematic partial cross-sectional view of an HVIC 506 (the semiconductor device) according to Embodiment 6. While the silicon single crystalline wafer is used for the HVIC 505 (FIG. 15: Embodiment 5), a Silicon on Insulator (SOI) wafer is used for the HVIC 506 (FIG. 16: Embodiment 6). The SOI wafer in Embodiment 6 has a structure in which the p-type substrate 10, a buried oxide film 190, and the n-type epitaxial layer 30 as a silicon single crystalline layer are stacked in order. The SOI wafer includes a trench isolation structure 181. The trench isolation structure 181 extends through the n-type epitaxial layer 30 to the buried oxide film 190. An inner structure of the trench isolation structure 181 may be similar to that of the trench isolation structure 180 (FIG. 15: Embodiment 5).

A configuration other than the above-mentioned configuration is substantially the same as the above-mentioned configuration in Embodiment 5, so that the same or corresponding elements bear the same reference signs, and description thereof is not repeated. According to Embodiment 6, a substantially similar effect to that obtained in Embodiment 5 is obtained in a case where the SOI wafer is used.

Embodiment 7

The signal conveyance element ES (FIG. 1) includes magnetically coupled coils in Embodiments 1 to 6 described above. The signal conveyance element may instead be configured by a capacitance. In Embodiment 7 and Embodiment 8 described below, an HVIC (the semiconductor device) including the signal conveyance element configured by the capacitance will be described.

Figure 19:
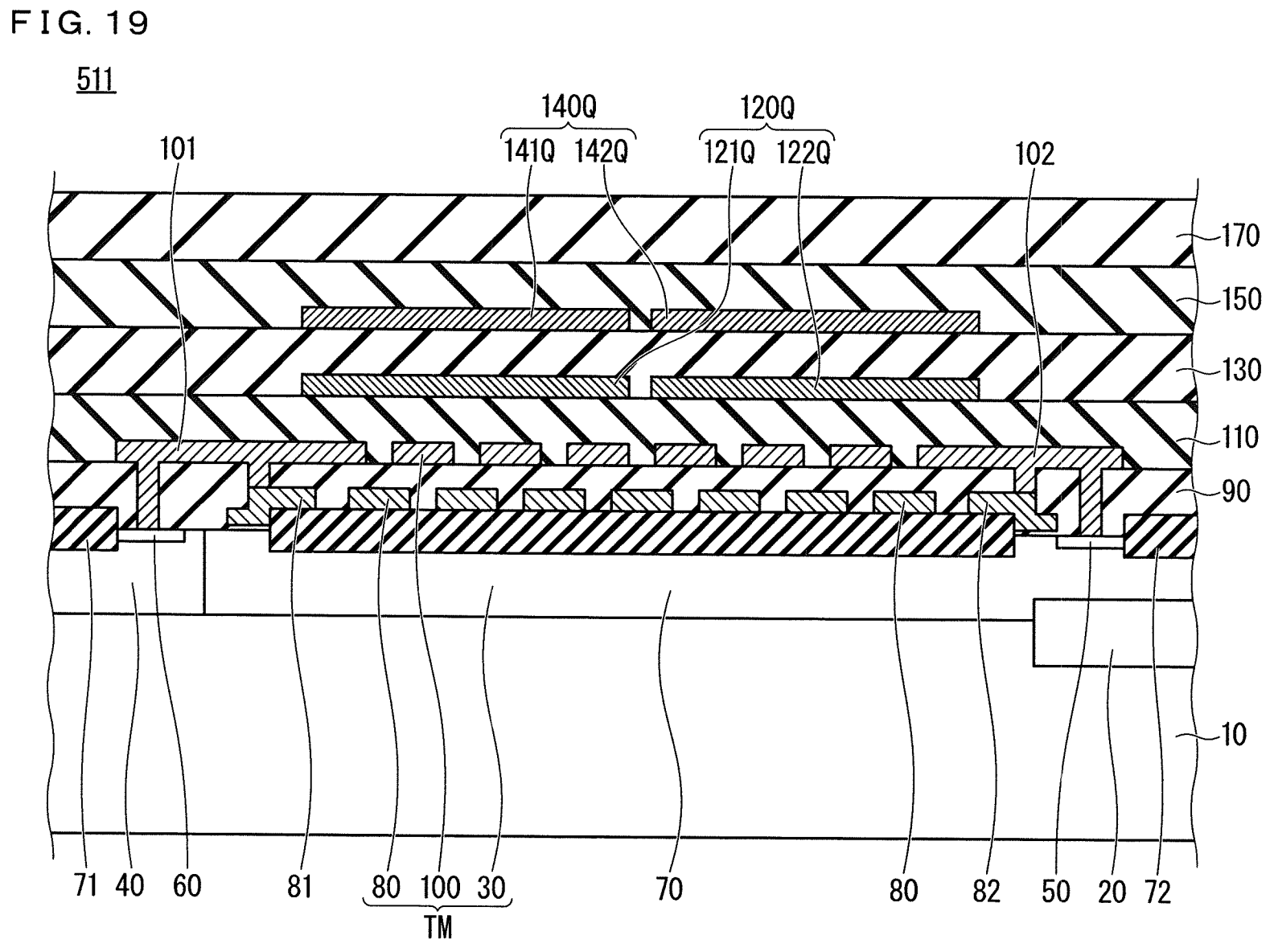

FIG. 17 is a plan view illustrating arrangement in the in-plane direction of two second electrode plates 140Q of the signal conveyance element of an HVIC 511 (the semiconductor device) according to Embodiment 7 along with two wiring layers extending from ends of the second electrode plates 140Q. FIG. 18 is a plan view illustrating arrangement in the in-plane direction of two first electrode plates 120Q of the signal conveyance element of the HVIC 511 according to Embodiment 7 along with two wiring layers extending from ends of the first electrode plates 120Q. FIG. 19 is a schematic partial cross-sectional view along the line XIX-XIX of FIG. 17.

The signal conveyance element of the HVIC 511 includes the two first electrode plates 120Q, that is, a first electrode plate 121Q and a first electrode plate 122Q, the interlayer insulating film 130, and the two second electrode plates 140Q, that is, a second electrode plate 141Q and a second electrode plate 142Q. The first electrode plate 121Q, the first electrode plate 122Q, the second electrode plate 141Q, and the second electrode plate 142Q are arranged in the isolation region RI. The interlayer insulating film 130 covers the two first electrode plates, that is, the first electrode plate 121Q and the first electrode plate 122Q. The second electrode plate 141Q and the second electrode plate 142Q are respectively separated from the first electrode plate 121Q and the first electrode plate 122Q by the interlayer insulating film 130. In other words, the second electrode plate 141Q and the second electrode plate 142Q respectively oppose the first electrode plate 121Q and the first electrode plate 122Q with the interlayer insulating film 130 therebetween in the thickness direction (a vertical direction in FIG. 19). The second electrode plate 141Q and the second electrode plate 142Q are thus arranged to respectively be capacitively coupled to the first electrode plate 121Q and the first electrode plate 122Q. To obtain efficient capacitive couplings, a planar layout of the second electrode plate 141Q (FIG. 17) and a planar layout of the first electrode plate 121Q (FIG. 18) may be substantially the same, and a planar layout of the second electrode plate 142Q (FIG. 17) and a planar layout of the first electrode plate 122Q (FIG. 18) may be substantially the same.

The second electrode plate 141Q and the second electrode plate 142Q (FIG. 17) are electrically connected to the high side circuit region RH respectively by a wiring layer WHa and a wiring layer WHb. The wiring layer WHa and the wiring layer WHb (FIG. 17) each include a metal wiring layer (not illustrated in FIG. 19) disposed in a common layer with the metal wiring layer 160 (FIG. 8) and are respectively connected to the second electrode plate 141Q and the second electrode plate 142Q through contact holes (not illustrated) formed in the insulating layer 150 (FIG. 19). The first electrode plate 121Q and the first electrode plate 122Q (FIG. 18) are electrically connected to the low side circuit region RL respectively by a wiring layer WLa and a wiring layer WLb. The wiring layer WLa and the wiring layer WLb (FIG. 18) each include a metal wiring layer (not illustrated in FIG. 19) disposed in the common layer with the metal wiring layers 100 (FIG. 19) and are respectively connected to the first electrode plate 121Q and the first electrode plate 122Q through contact holes (not illustrated) formed in the insulating layer 110 (FIG. 19).

The first electrode plate 122Q (FIG. 18) is disposed between the first electrode plate 121Q and the high side circuit region RH, and the second electrode plate 142Q (FIG. 17) is disposed between the second electrode plate 141Q and the high side circuit region RH. Specifically, the second electrode plate 142Q (FIG. 17) surrounds the high side circuit region RH. The second electrode plate 141Q (FIG. 17) surrounds the second electrode plate 142Q and the high side circuit region RH while being spaced a distance apart from the second electrode plate 142Q. The first electrode plate 122Q (FIG. 18) surrounds the high side circuit region RH. The first electrode plate 121Q (FIG. 18) surrounds the first electrode plate 122Q and the high side circuit region RH while being spaced a distance apart from the first electrode plate 122Q.

A configuration other than the above-mentioned configuration is substantially the same as the above-mentioned configuration in Embodiment 1, so that the same or corresponding elements bear the same reference signs, and description thereof is not repeated. According to Embodiment 7, the signal conveyance element is configured not by the coils but by the capacitance, so that a malfunction resulting from external magnetic noise can be suppressed.

Embodiment 8

Figure 20:
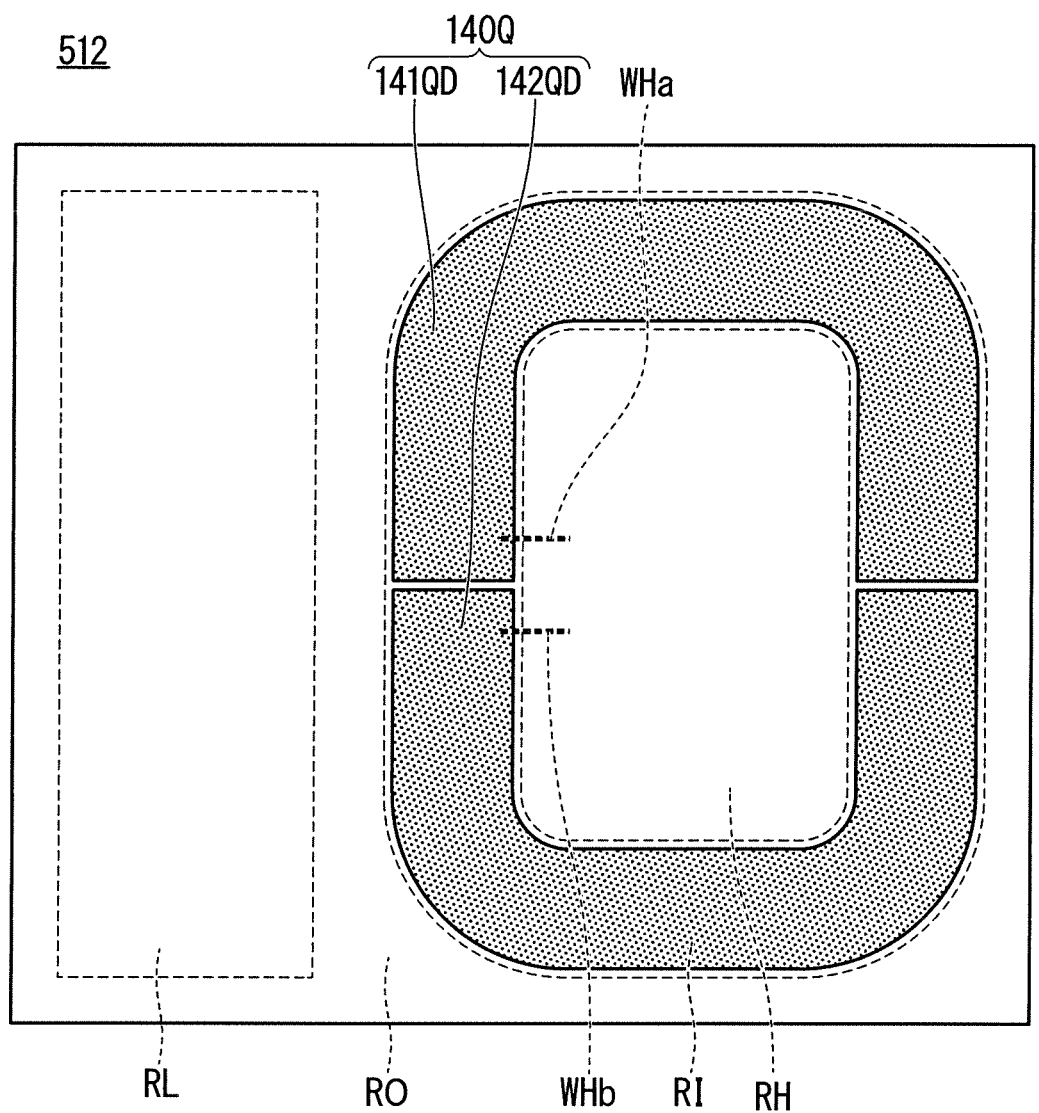
FIG. 20 is a plan view illustrating arrangement in the in-plane direction of two second electrode plates of a signal conveyance element of a semiconductor device according to Embodiment 8 along with two wiring layers extending from ends of the second electrode plates.

FIG. 20 is a plan view illustrating arrangement in the in-plane direction of the two second electrode plates 140Q of the signal conveyance element of an HVIC 512 (the semiconductor device) according to Embodiment 8 along with two wiring layers extending from ends of the second electrode plates 140Q. FIG. 21 is a plan view illustrating arrangement in the in-plane direction of the two first electrode plates 120Q of the signal conveyance element of the HVIC 512 according to Embodiment 8 along with two wiring layers extending from ends of the first electrode plates 120Q. The HVIC 512 according to Embodiment 8 includes first electrode plates 120QD (FIG. 21: Embodiment 8) and second electrode plates 140QD (FIG. 20: Embodiment 8) in place of the first electrode plates 121Q, 122Q (FIG. 18: Embodiment 7) and the second electrode plates 141Q, 142Q (FIG. 17: Embodiment 7).

A first electrode plate 121QD and a first electrode plate 122QD as the two first electrode plates 120Q are adjacent in one direction (a vertical direction in FIG. 21), and a second electrode plate 141QD and a second electrode plate 142QD as the two second electrode plates 140Q are adjacent in the one direction (a vertical direction in FIG. 20). In contrast to Embodiment 7, each electrode plate does not completely surround the high side circuit region RH in Embodiment 8. Specifically, in a case where the isolation region RI is divided into an upper side (generally speaking, one side in a direction) and a lower side (generally speaking, the other side in the direction) in FIGS. 20 and 21 to define an imaginary upper section and an imaginary lower section, the first electrode plate 121QD (FIG. 21) and the second electrode plate 141QD (FIG. 20) are arranged in the upper section, and the first electrode plate 122QD (FIG. 21) and the second electrode plate 142QD (FIG. 20) are arranged in the lower section. A boundary between the upper section and the lower section can be determined by one imaginary straight line in an example illustrated in FIGS. 20 and 21. To obtain efficient capacitive couplings, a planar layout of the second electrode plate 141QD (FIG. 20) and a planar layout of the first electrode plate 121QD (FIG. 21) may be substantially the same, and a planar layout of the second electrode plate 142QD (FIG. 20) and a planar layout of the first electrode plate 122QD (FIG. 21) may be substantially the same.

A configuration other than the above-mentioned configuration is substantially the same as the above-mentioned configuration in Embodiment 7, so that the same or corresponding elements bear the same reference signs, and description thereof is not repeated.

According to Embodiment 8, the first electrode plate 121QD and the first electrode plate 122QD are adjacent in the one direction (vertical direction in FIG. 21), and the second electrode plate 141QD and the second electrode plate 142QD are adjacent in the one direction (vertical direction in FIG. 20). A configuration including a pair of the first electrode plate 121QD and the second electrode plate 141QD and a configuration including a pair of the first electrode plate 122QD and the second electrode plate 142QD can thus be designed to be line symmetric (or substantially line symmetric) in the in-plane direction. Capacitances of these configurations can thus easily be caused to substantially match. To increase the effect, the first electrode plate 121QD and the first electrode plate 122QD as the two first electrode plates 120Q may be arranged to be line symmetric with respect to one straight line (an unillustrated straight line passing through a center and extending transversely in FIG. 21), and the second electrode plate 141QD and the second electrode plate 142QD as the two second electrode plates 140QD may be arranged to be line symmetric with respect to the one straight line (an unillustrated straight line passing through a center and extending transversely in FIG. 20).

Embodiments can freely be combined with each other and can be modified or omitted as appropriate.

APPENDICES

Various aspects of the present disclosure will collectively be described below as appendices.
<Appendix 1>
A semiconductor device (501 to 506) having a first circuit region (RL), a second circuit region (RH), and an isolation region (RI) separating the first circuit region (RL) and the second circuit region (RH), and including a signal conveyance element (ES) to convey a signal from the first circuit region (RL) to the second circuit region (RH), the semiconductor device (501 to 506) comprising:
    a first drive circuit (210) disposed in the first circuit region (RL) and having a first reference potential (GND);
    a second drive circuit (220) disposed in the second circuit region (RH) and having a second reference potential (VS) as a floating potential electrically separated from the first reference potential (GND);
    a high voltage junction termination (TM) disposed in the isolation region (RI) to secure a breakdown voltage between the first circuit region (RL) and the second circuit region (RH);
    at least one primary coil (120, 120S) having opposite ends electrically connected to the first circuit region (RL), having a coil axis in the second circuit region (RH) or the isolation region (RI), and disposed in the isolation region (RI);
    an insulating film (130) covering the at least one primary coil (120, 120S); and
    two secondary coils (141, 142; 141D, 142D) each having opposite ends electrically connected to the second circuit region (RH), each having a coil axis in the second circuit region (RH) or the isolation region (RI), separated from the at least one primary coil (120, 120S) by the insulating film (130), arranged in the isolation region (RI) to be magnetically coupled to the at least one primary coil (120, 120S), and included in the signal conveyance element (ES) along with the at least one primary coil (120, 120S).
<Appendix 2>
The semiconductor device (501 to 506) according to Appendix 1, wherein
    the high voltage junction termination (TM) includes at least one selected from the group consisting of a resurf isolation structure (30) with a field plate (80, 100; 83) and a trench isolation structure (180; 181).
<Appendix 3>
The semiconductor device (501 to 503; 505; 506) according to Appendix 2, wherein the field plate (80, 100; 83) includes a capacitive field plate (80, 100).

<Appendix 4>

The semiconductor device (504) according to Appendix 2 or 3, wherein the field plate (80, 100; 83) includes a resistive field plate (83).

<Appendix 5>

The semiconductor device (501; 503 to 506) according to any one of Appendices 1 to 4, wherein the at least one primary coil (120) includes two primary coils (121, 122; 121D, 122D).

<Appendix 6>

The semiconductor device (503) according to Appendix 5, wherein the two primary coils (121D, 122D) and the two secondary coils (141D, 142D) each have a coil axis in the isolation region (RI).

<Appendix 7>

The semiconductor device (502) according to any one of Appendices 1 to 4, wherein the at least one primary coil (120; 120S) is a single primary coil (120S).

<Appendix 8>

A semiconductor device (511, 512) having a first circuit region (RL), a second circuit region (RH), and an isolation region (RI) separating the first circuit region (RL) and the second circuit region (RH), and including a signal conveyance element to convey a signal from the first circuit region (RL) to the second circuit region (RH), the semiconductor device (511, 512) comprising:

a first drive circuit (210) disposed in the first circuit region (RL) and having a first reference potential (GND);

a second drive circuit (220) disposed in the second circuit region (RH) and having a second reference potential (VS) as a floating potential electrically separated from the first reference potential (GND);

a high voltage junction termination (TM) disposed in the isolation region (RI) to secure a breakdown voltage between the first circuit region (RL) and the second circuit region (RH);

two first electrode plates (121Q, 122Q; 121QD, 122QD) electrically connected to the first circuit region (RL) and arranged in the isolation region (RI);

an insulating film (130) covering the two first electrode plates (121Q, 122Q; 121QD, 122QD); and two second electrode plates (141Q, 142Q; 141QD, 142QD) electrically connected to the second circuit region (RH), separated from the two first electrode plates (121Q, 122Q; 121QD, 122QD) by the insulating film (130), arranged in the isolation region (RI) to be capacitively coupled to the respective two first electrode plates (121Q, 122Q; 121QD, 122QD), and included in the signal conveyance element along with the two first electrode plates (121Q, 122Q; 121QD, 122QD).

<Appendix 9>

The semiconductor device (511) according to Appendix 8, wherein one (122Q) of the two first electrode plates (121Q, 122Q) is disposed between the other one (121Q) of the two first electrode plates (121Q, 122Q) and the second circuit region (RH), and one (142Q) of the two second electrode plates (141Q, 142Q) is disposed between the other one (141Q) of the two second electrode plates (141Q, 142Q) and the second circuit region (RH).

<Appendix 10>

The semiconductor device (512) according to Appendix 8, wherein the two first electrode plates (121QD, 122QD) are adjacent in one direction, and the two second electrode plates (141QD, 142QD) are adjacent in the one direction.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device having a first circuit region, a second circuit region, and an isolation region separating the first circuit region and the second circuit region, and including a signal conveyance element to convey a signal from the first circuit region to the second circuit region, the semiconductor device comprising:

a first drive circuit disposed in the first circuit region and having a first reference potential;

a second drive circuit disposed in the second circuit region and having a second reference potential as a floating potential electrically separated from the first reference potential;

a high voltage junction termination disposed in the isolation region to secure a breakdown voltage between the first circuit region and the second circuit region;

at least one primary coil having opposite ends electrically connected to the first circuit region, having a coil axis in the second circuit region or the isolation region, and disposed in the isolation region;

an insulating film covering the at least one primary coil; and two secondary coils each having opposite ends electrically connected to the second circuit region, each having a coil axis in the second circuit region or the isolation region, separated from the at least one primary coil by the insulating film, arranged in the isolation region to be magnetically coupled to the at least one primary coil, and included in the signal conveyance element along with the at least one primary coil.

2. The semiconductor device according to claim 1, wherein the high voltage junction termination includes at least one selected from the group consisting of a resurf isolation structure with a field plate and a trench isolation structure.

3. The semiconductor device according to claim 2, wherein the field plate includes a capacitive field plate.

4. The semiconductor device according to claim 2, wherein the field plate includes a resistive field plate.

5. The semiconductor device according to claim 1, wherein the at least one primary coil includes two primary coils.

6. The semiconductor device according to claim 5, wherein the two primary coils and the two secondary coils each have a coil axis in the isolation region.

7. The semiconductor device according to claim 1, wherein the at least one primary coil is a single primary coil.

* * * * *